(12) United States Patent
Akerib et al.

(10) Patent No.: US 8,332,580 B2
(45) Date of Patent: Dec. 11, 2012

(54) SYSTEM, METHOD AND APPARATUS FOR MEMORY WITH EMBEDDED ASSOCIATIVE SECTION FOR COMPUTATIONS

(75) Inventors: Avidan Akerib, Tel Aviv (IL); Eli Ehrman, Bet Shemesh (IL); Josh Meir, Tel-Mond (IL); Moshe Meyassed, Kadima (IL); Oren Agam, Zichron Ya'acov (IL); Yair Alpern, Tivon (IL)

(73) Assignee: ZikBit Ltd., Caesaria (IL)

( * ) Notice: Subject to any disclaimer, the term of this patent is extended or adjusted under 35 U.S.C. 154(b) by 669 days.

(21) Appl. No.: 12/464,937

(22) Filed: May 13, 2009

(65) Prior Publication Data

US 2009/0303767 A1 Dec. 10, 2009

Related U.S. Application Data

(63) Continuation-in-part of application No. 12/119,197, filed on May 12, 2008.

(60) Provisional application No. 61/072,931, filed on Apr. 2, 2008, provisional application No. 61/143,169, filed on Jan. 8, 2009.

(51) Int. Cl.
*G06F 12/00* (2006.01)

(52) U.S. Cl. .................... 711/108; 711/104; 365/189.2

(58) Field of Classification Search .................. 711/108, 711/104; 365/49.1, 189.2
See application file for complete search history.

(56) References Cited

U.S. PATENT DOCUMENTS

| | | | | | |
|---|---|---|---|---|---|
| 5,038,282 | A | * | 8/1991 | Gilbert et al. | 712/14 |
| 5,634,038 | A | * | 5/1997 | Saitoh | 711/163 |
| 5,930,359 | A | * | 7/1999 | Kempke et al. | 713/160 |
| 6,163,829 | A | * | 12/2000 | Greim et al. | 710/260 |
| 6,195,738 | B1 | * | 2/2001 | Akerib | 712/12 |
| 6,467,020 | B1 | * | 10/2002 | Stilkol et al. | 711/108 |
| 6,732,227 | B1 | * | 5/2004 | Baumann | 711/108 |
| 2003/0007408 | A1 | * | 1/2003 | Lien et al. | 365/222 |
| 2007/0143287 | A1 | * | 6/2007 | Adl-tabatabai et al. | 707/8 |

* cited by examiner

*Primary Examiner* — Jared Rutz
*Assistant Examiner* — Gurtej Bansal
(74) *Attorney, Agent, or Firm* — Pearl Cohen Zedek Latzer, LLP

(57) ABSTRACT

An integrated circuit device includes a semiconductor substrate and an array of random access memory (RAM) cells, which are arranged on the substrate in first columns and are configured to store data. A computational section in the device includes associative memory cells, which are arranged on the substrate in second columns, which are aligned with respective first columns of the RAM cells and are in communication with the respective first columns so as to receive the data from the array of the RAM cells and to perform an associative computation on the data.

88 Claims, 14 Drawing Sheets

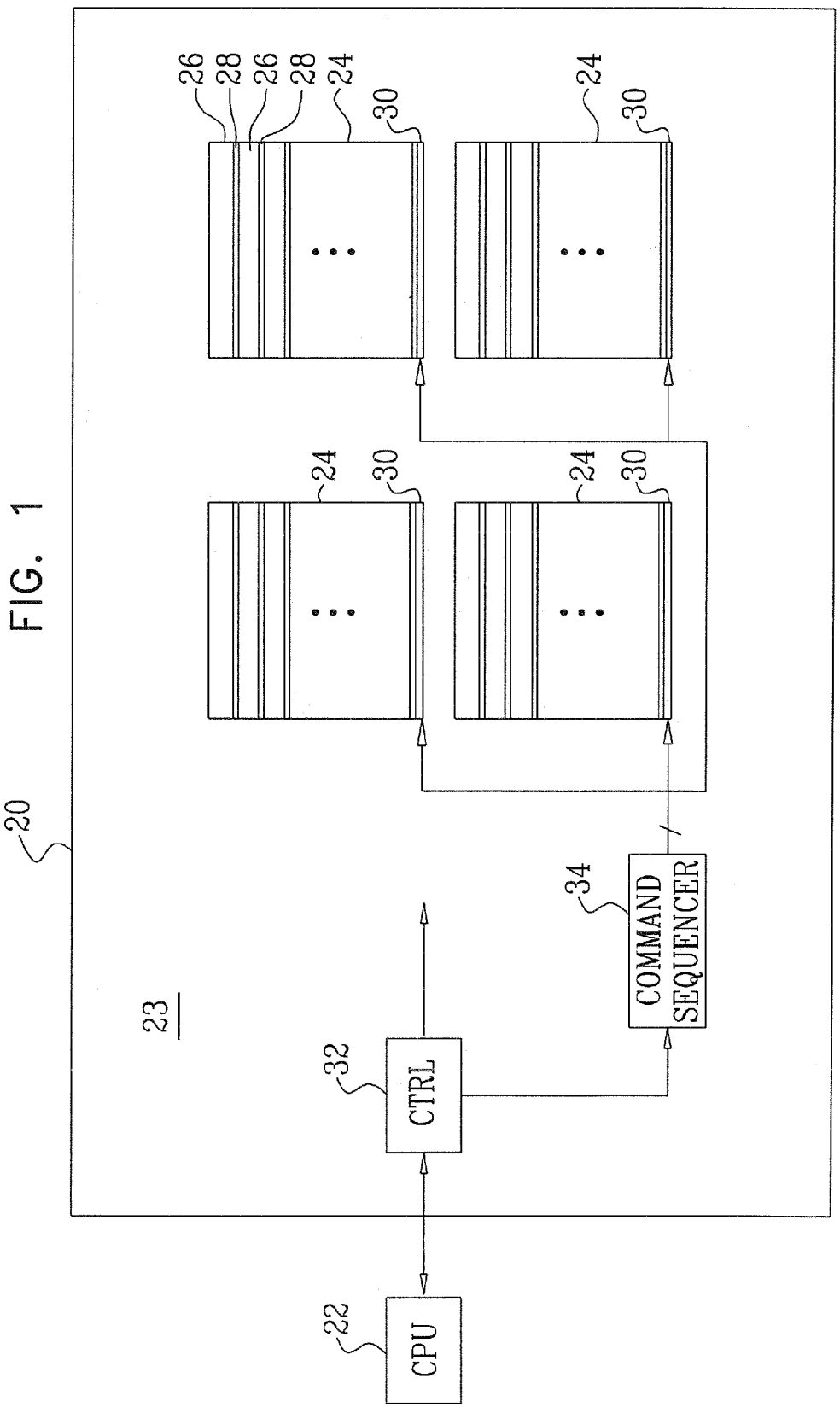

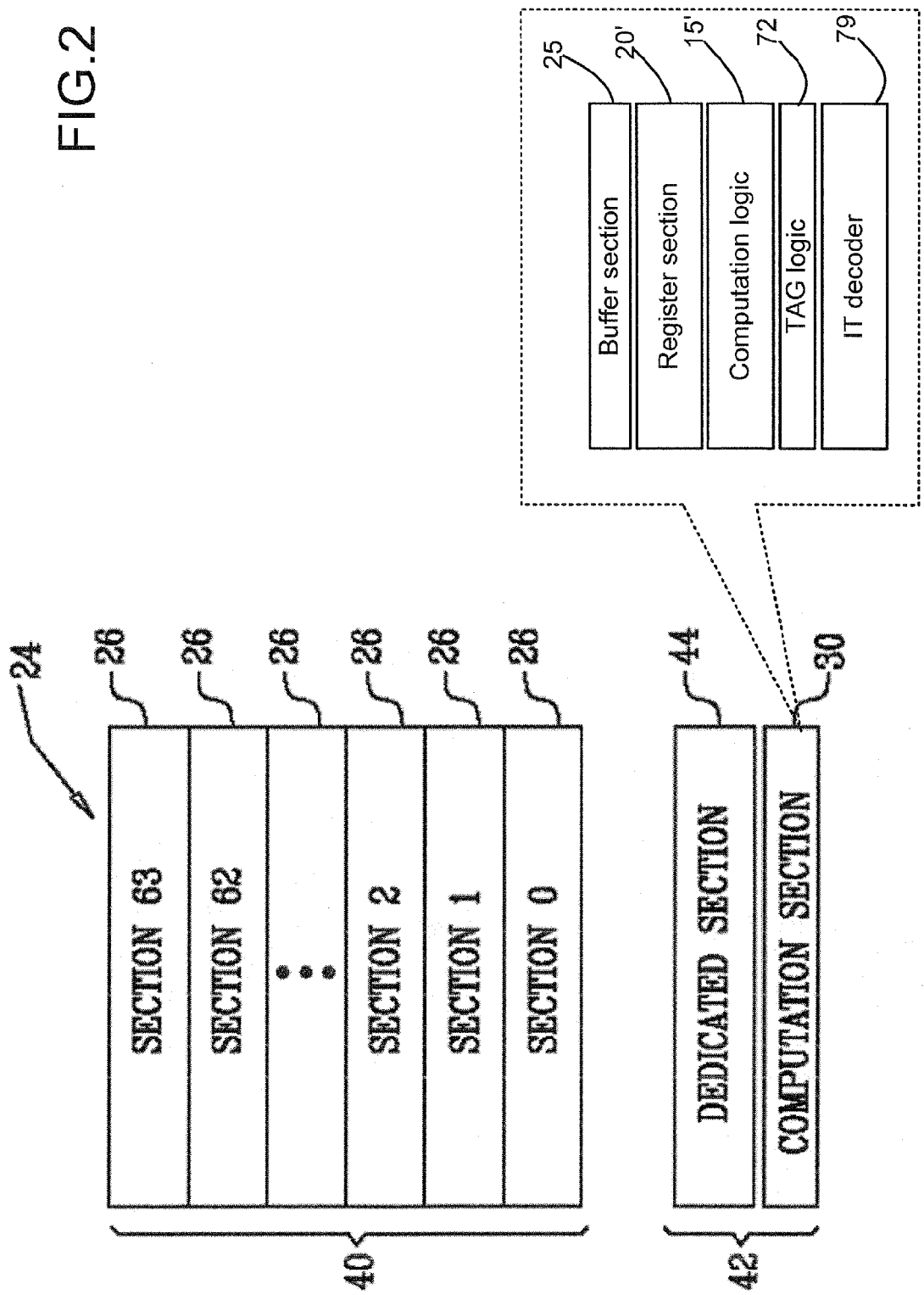

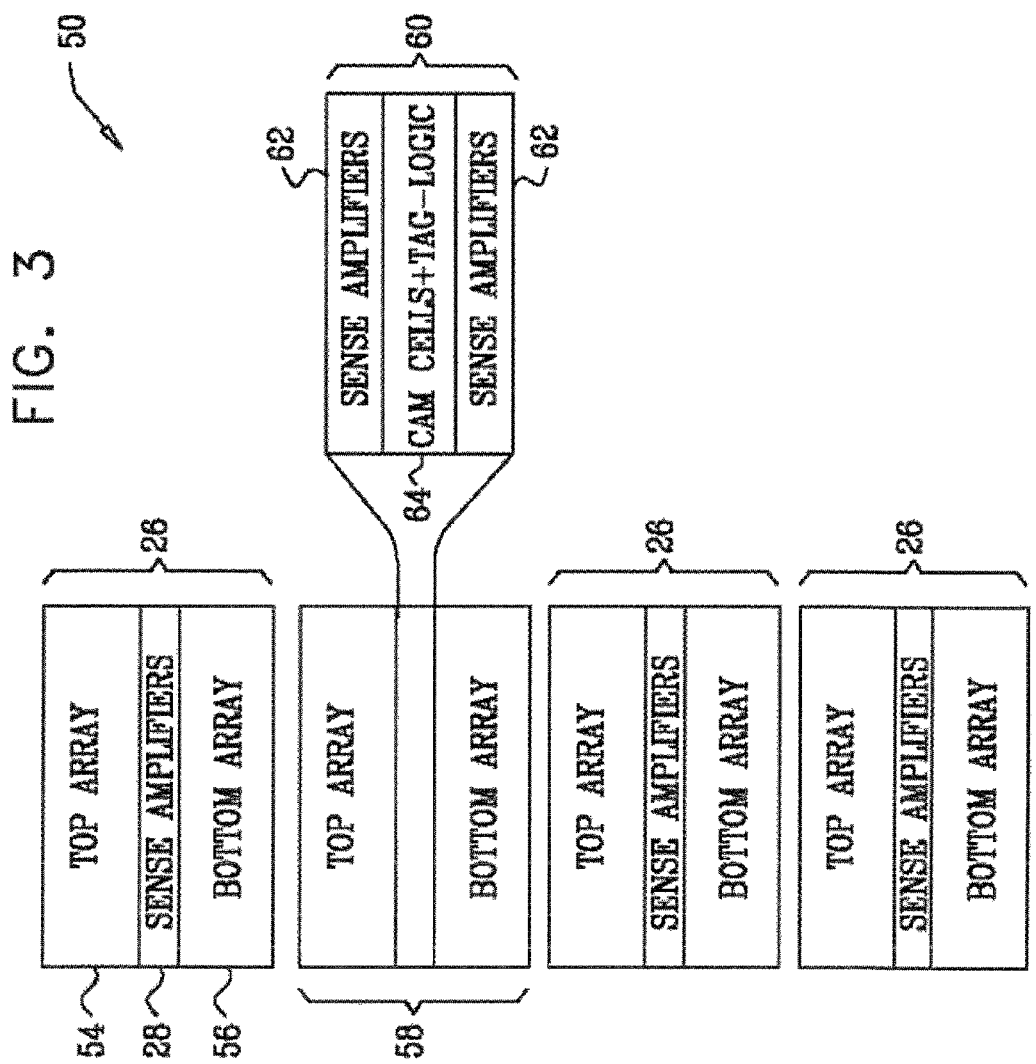

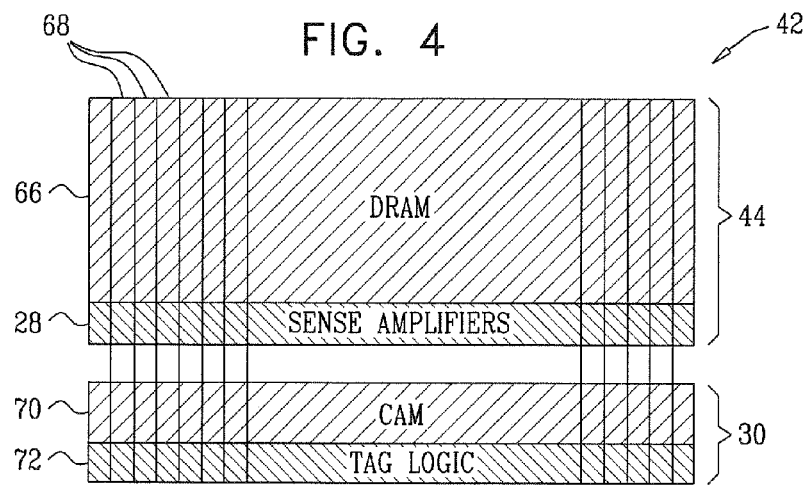
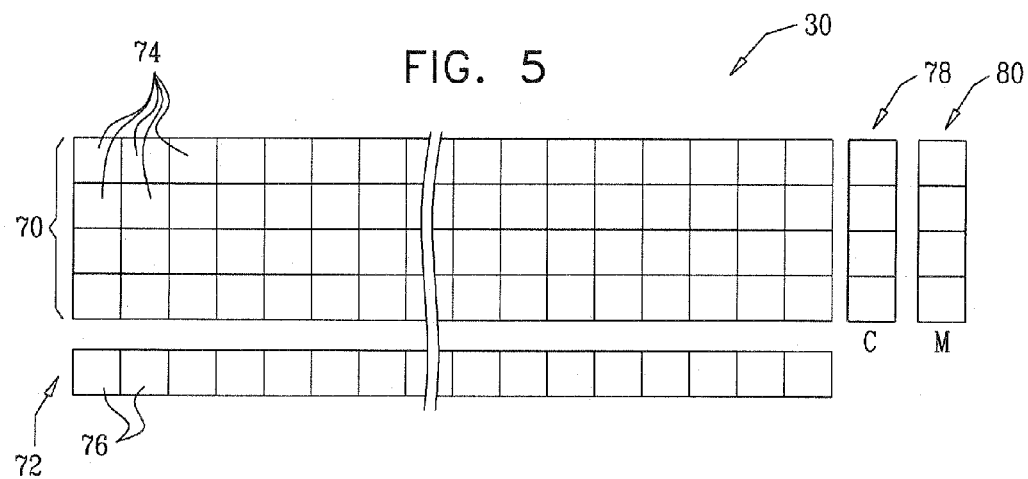
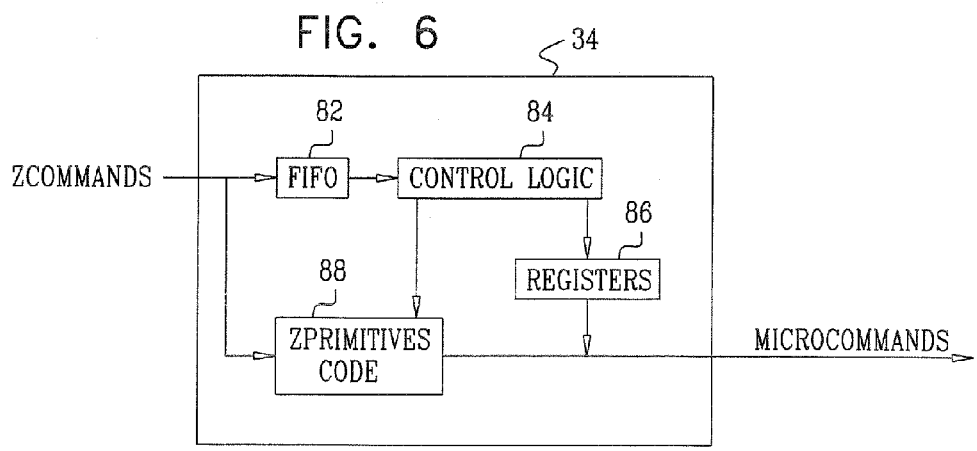

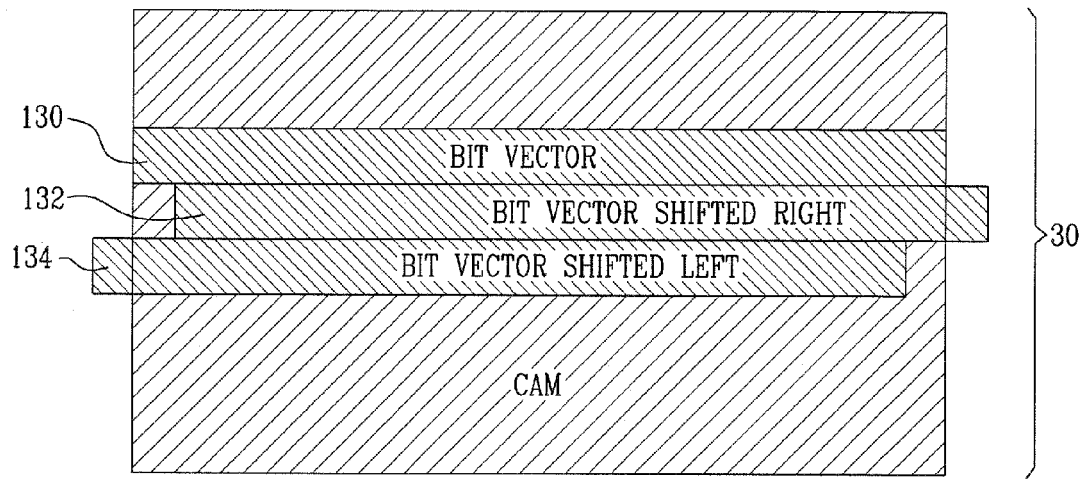
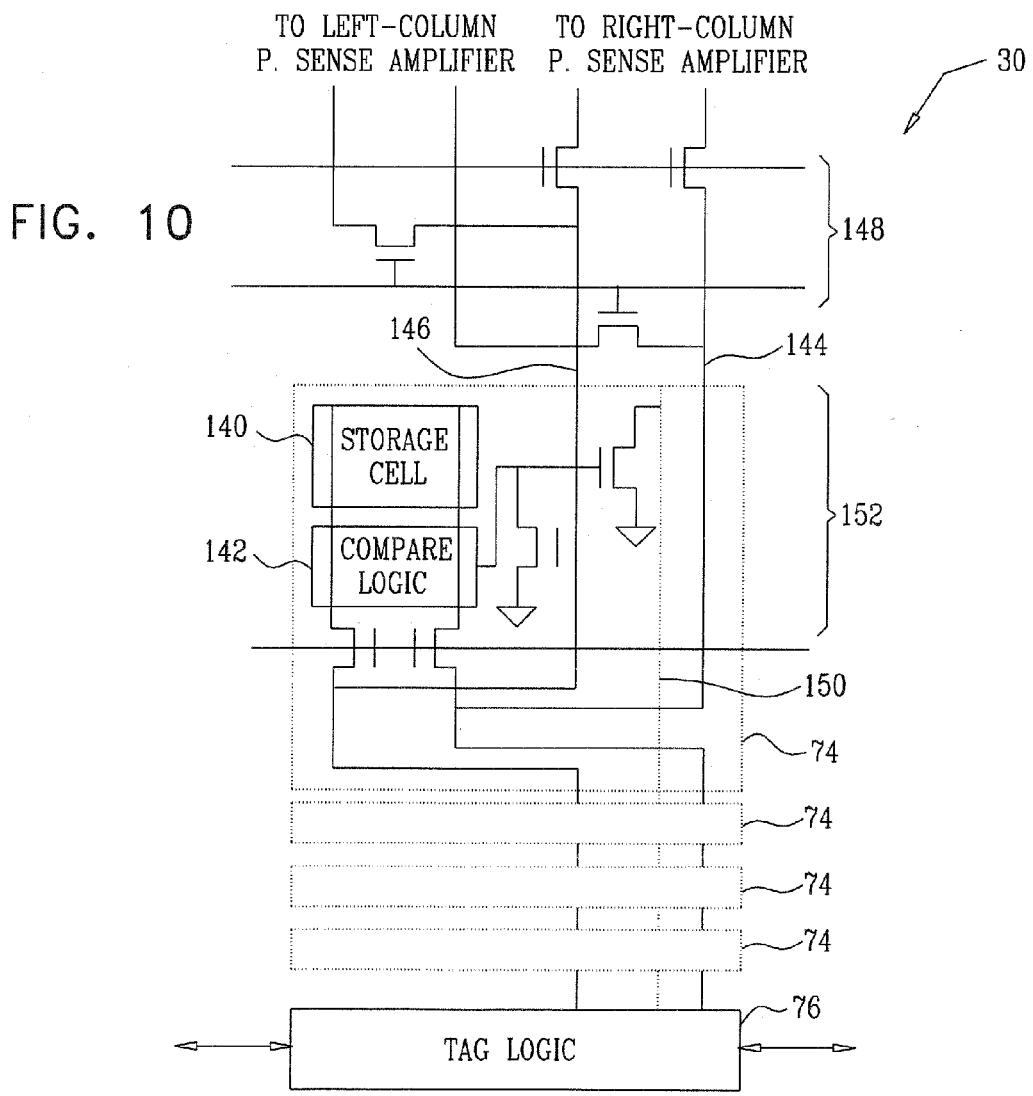

300  FIG.15A
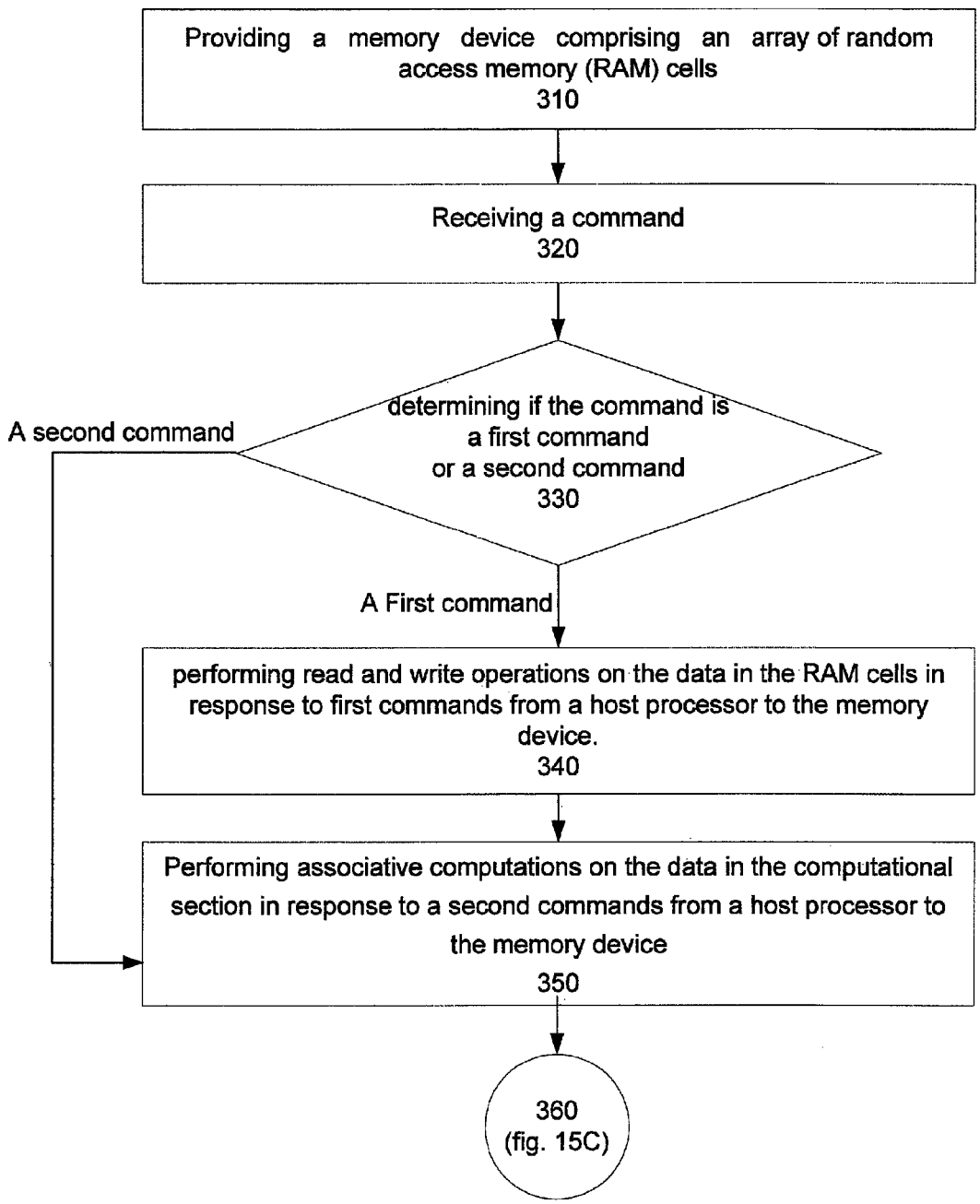

FIG.15B

Performing associative computations on the data in the computational section in response to a second commands from a host processor to the memory device
350

Controlling the associative computation by a microcontroller
351

Receiving, by the microcontroller, a command from a host processor invoking the associative computation, and issuing, responsively to the command, at least one sequence of micro-commands that cause the computational section to perform the associative computation, and to return a result to the array of the RAM cells.
352

Receiving, by the microcontroller, a command from a host processor invoking the associative computation, and to issuing, responsively to the command, multiple micro-commands that cause the computational section to perform the associative computation, and returning at least one result to the array of the RAM cells
353

Implementing, by the microcontroller, a finite state machine.
354

Storing stage information in few state registers of the microcontroller.
355

Receiving, by a control logic that is less complex than a microcontroller, a command from a host processor invoking the associative computation; issuing, responsively to the command, a sequence of micro-commands that cause the computational section to perform the associative computation, and returning a result to the array of the RAM cells.
356 controlling the flow of micro-commands by the microcontroller
357

Facilitating an access to RAM cells from an external component by utilizing at least one decoder and facilitating an access to RAM cells from the computational section by utilizing at least one other decoder.
361

Allowing simultaneous accesses to different RAM cells.
362

Allowing an access by the computational section and allowing another simultaneous access by an external component.
363

Blocking at least one portion of the array of RAM cells from access of external components and allowing the computational section to access the at least one portion.
364

Blocking at least one bank from access of external components and allowing the computational section to access the at least one bank.
365

Controlling an access of an external component to at least a portion of the array of RAM cells by a semaphore.
366

Attempting to read the semaphore, by an external component, a predetermined period after a reading a semaphore indicative that the external component is temporarily prevented from accessing the at least portion of the array of RAM cells.
367

Preventing the computational section from directly accessing the array of RAM cells.
368

Receiving, by the computational section a read command from RAM cells of the host computer and copying a content of the RAM cells to the computational section.
369

Receiving, by a computational section controller, a read from RAM cells command of the host computer and copying a content of the RAM cells to the storage cells.
370

Outputting, by at least one hardware port, information indicative of an accessibility of at least one portion of an array of RAM cells.
371

Providing a memory device comprising an array of random access memory (RAM) cells, which are disposed on a semiconductor substrate and are configured to store data, and comprising a computational section, which comprises associative memory cells, and storage cells
410

Includes storing at a buffer section of the computational section information from RAM cells of the array of RAM cells. The information can be provided from one row of RAM cells to one row of the buffer section.
420

Storing at multiple storage cells information from the buffer section of the computational section.
422 providing the information to associative memory cells of the computational section. An entire row or a portion thereof can be transferred and stored.
424

Storing at multiple storage cells information from the memory associative cells.
430

Storing at a buffer section of the computational section information from the multiple storage cells.
432

Sending to of RAM cells the information from the buffer section.
334

Selectively isolating cells
450

Selectively isolating the buffer section from the storage cells by first barrier transistors.
451

Selectively isolating the associative memory cells from the storage cells by second barrier transistors.
452

Isolating, during a first operational mode, the associative memory cells from the storage cells while providing connectivity between the buffer section and the storage cells; and isolating, during a second operational mode, between the buffer section and the storage cells while providing connectivity between the associative memory cells and the storage cells.
453

Selectively isolating the associative memory cells from the register cells by second barrier transistors.
454

SYSTEM, METHOD AND APPARATUS FOR MEMORY WITH EMBEDDED ASSOCIATIVE SECTION FOR COMPUTATIONS

CROSS-REFERENCE TO RELATED APPLICATIONS

This application is a continuation-in-part of U.S. patent application Ser. No. 12/119,197, filed May 12, 2008, which in turn claims priority from US Provisional Patent Application No. 61/072,931, filed Apr. 2, 2008, the entire contents of which are incorporated herein by reference. This application claims the benefit of U.S. Provisional Patent Application No. 61/143,169, filed Jan. 8, 2009, the entire contents of which are incorporated herein by reference.

FIELD OF THE INVENTION

The present invention relates generally to memory devices, and particularly to incorporation of parallel data processing functions in memory devices.

BACKGROUND OF THE INVENTION

Various methods and systems are known in the art for accessing and processing data that are stored in memory. Some known methods and systems use content-addressable techniques, in which stored data are addressed by their content, rather than by storage address, Content-addressable techniques are also sometimes referred to as associative processing techniques.

A parallel architecture for machine vision based on an associative processing approach is described, for example, in a Ph.D. thesis by Akerib, entitled "Associative Real-Time Vision Machine" (Department of Applied Mathematics and Computer Science, Weizmann Institute of Science, Rehovot, Israel, March, 1992), which is incorporated herein by reference.

The most common types of memory devices currently in use are random access memory (RAM) devices, such as dynamic random access memory (DRAM) and static random access memory (SRAM). A RAM device allows a memory circuit to read and write data by specifying the addresses of the data in the memory.

Content addressable memory (CAM) is a special type of memory device, which is typically used to accelerate applications requiring fast content searching. Searches in CAM devices are performed by simultaneously comparing an input data value (in the form of a string of bits in a comparand register) against the pre-stored entries in the memory. When the entry stored in a CAM memory location matches the data in the comparand register, a local match detection circuit returns a match indication. In addition, the CAM may return an address or addresses associated with the matched data. Binary CAM uses data search words composed entirely of ones and zeroes. Ternary CAM allows a third matching state of "X" or "Don't Care," typically by adding a mask bit to every memory cell.

Some devices may include both RAM and CAM segments. For example, U.S. Pat. No. 3,685,020, whose disclosure is incorporated herein by reference, describes a compound memory that includes a random access array with an associative array as part of its accessing means. A match in the associative array between an effective address, identifying an addressed information block, and an associative array word directly energizes corresponding random access array locations that contain the addressed information block.

As another example, U.S. Pat. No. 5,706,224, whose disclosure is incorporated herein by reference, describes a semiconductor memory device that is partitionable into RAM and CAM subfields. Each of the CAM cells comprises a RAM cell attached to a comparator. The user may partition the memory array into a number of segments, some or all of which may be configured to function as simple RAM, rather than as CAM.

U.S. Pat. No. 6,195,738, whose disclosure is incorporated herein by reference, describes an architecture combining an associative processor memory array and a random access memory, which is used to store temporary results and parameters. Parallel communication between thousands of memory words in the associative memory array and the random access memory is provided via logic hardware.

SUMMARY OF EMBODIMENTS OF THE INVENTION

An integrated circuit device that includes a semiconductor substrate; an array of random access memory (RAM) cells, which are arranged on the substrate in first columns and are configured to store data; and a computational section comprising associative memory cells, which are arranged on the substrate in second columns, which are aligned with respective first columns of the RAM cells and are in communication with the respective first columns so as to receive the data from the array of the RAM cells and to perform an associative computation on the data.

The device can include at least one of the following or a combination thereof: (i) a microcontroller; (ii) at least one decoder that is utilized for accesses from external components and at least one other decoder that is utilized for accesses from the computational section; (iii) an interfacing circuitry that enables simultaneous accesses to the array of RAM cells.

An access of an external component to at least a portion of the array of RAM cells can be controlled by a semaphore.

The computational section can be at least temporarily prevented from directly accessing the array of RAM cells.

The device can include at least one hardware port that outputs information indicative of an accessibility of at least one portion of an array of RAM cells.

The computational section can include multiple storage cells configured to store information; wherein storage cells are smaller, faster or less complex than associative memory cells.

The device can include an internal transfer controller that controls transfers of a portion of a column.

A method for computing is provided. It can include: accepting and executing at least one command from a host processor to a memory device, the at least one command comprising a write command to store data at a specified address in an array of random access memory (RAM) cells formed on a semiconductor substrate in the memory device; responsively to the at least one command, transferring the data into a computational section of the memory device, the computational section comprising associative memory cells, which are disposed on the semiconductor substrate in communication with the array of the RAM cells; and performing an associative computation on the data in the computational section.

The method can include controlling the associative computation by a microcontroller.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanied drawings in which:

FIG. 1 is a block diagram that schematically illustrates a memory device, in accordance with an embodiment of the present invention;

FIG. 2 is a block diagram that schematically illustrates a memory bank with a computational section, in accordance with an embodiment of the present invention;

FIG. 3 is a block diagram that schematically illustrates a memory bank with a computational section, in accordance with another embodiment of the present invention;

FIG. 4 is a block diagram that schematically shows a part of a memory bank that includes a computational section, in accordance with an embodiment of the present invention;

FIG. 5 is a block diagram that schematically shows details of a computational section of a memory bank, in accordance with an embodiment of the present invention;

FIG. 6 is a block diagram that schematically shows details of a command sequencer, in accordance with an embodiment of the present invention;

FIG. 9 is a block diagram that schematically illustrates a method for performing a neighborhood computation using a computational section in a memory array, in accordance with an embodiment of the present invention;

FIG. 10 is a schematic circuit diagram illustrating a column of associative cells in a computational section, in accordance with an embodiment of the present invention;

FIG. 15A illustrates a method for computing, according to an embodiment of the invention;

FIGS. 15B and 15C illustrates stages of the method of FIG. 15A, according to an embodiment of the invention; and FIG. 16 illustrates a method for computing, according to an embodiment of the invention.

Figure 7:
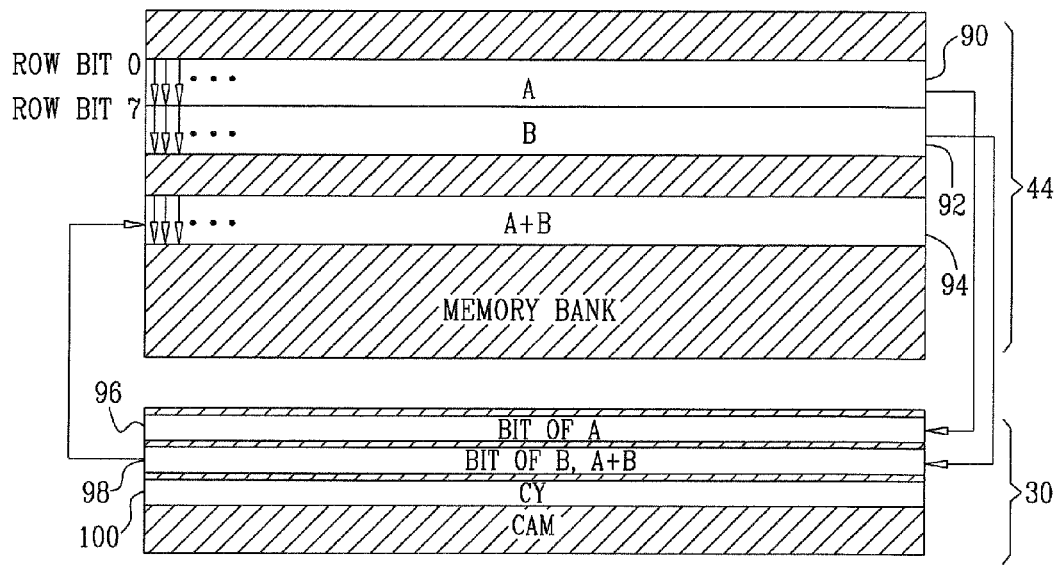
FIG. 7 is a block diagram that schematically illustrates a computation performed by a computational section in a memory, in accordance with an embodiment of the present invention.

It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. Moreover, some of the blocks depicted in the drawings may be combined into a single function.

DETAILED DESCRIPTION OF EMBODIMENTS OF THE INVENTION

In the following detailed description, numerous specific details are set forth in order to provide a thorough understanding of the invention. However, it will be understood by those of ordinary skill in the art that the present invention may be practiced without these specific details and that generalization for different programming languages, hardware architectures, operating systems, and resources is possible. In other instances, well-known methods, procedures, components, and circuits may not have been described in detail so as not to obscure the present invention.

Overview

In embodiments of the present invention that are described hereinbelow, a memory device includes a microcontroller, a RAM along with one or more special sections containing associative memory cells, which may be used to perform parallel computations at high speed. Integrating these associative sections (that form a computational section) into the memory device together with the RAM minimizes the time needed to transfer data into and out of the associative sections, and thus enables the device to perform logical and arithmetic operations on large vectors of bits far faster than would be possible in conventional processor architectures. The microcontroller can control the execution of multiple micro-instructions and apply flow control. The micro-instructions can be arranged in sequences that are memory mapped to address of the RAM—they are stored in the RAM and can be retrieved by utilizing addresses of the RAM. An execution of one or more sequences of micro-instructions can be triggered by a single command sent from the host computer.

Conveniently, memory mapped instruction can refer to an execution of a "memory mapped" instruction as if it is a simple read or write instruction to the DRAM chip. However, the internal logic of the RAM can simply intercept this memory mapped instruction and interprets it as a so-called zInstruction. As a result, the processing section can execute a series of micro instruction but their arrangement in memory can be irrelevant. The micro instructions can be located in other locations.

In addition to launching an execution of some kind on the microcontroller, the original memory read or write might still take place (thus data might be placed on the output bus) in order to conform to the expectations of external hardware (normally a memory controller).

The address of which is used in the memory mapped instruction might be outside the physical memory range of the RAM (thus for a 512 MB chip it might refer to a byte address of 512,000,001) or it might use an address inside the address range but which other hardware will not access.

Conveniently, a device is provided in which the RAM has functionality in addition to storage capabilities (this additional functionality can include processing and particularly associative processing). This functionality can be provided while maintaining the external formats of memory reads and writes (native to the RAM).

In embodiments of the present invention the RAM can serve multiple simultaneous accesses. One access can be related to the computational section while another access can be related to an external component.

The associative cells (also referred to as associative memory cells) of the computational section are functionally and structurally similar to CAM cells, in that comparators are built into each associative memory section so as to enable multiple multi-bit data words in the section to be compared simultaneously to a multi-bit comparand. (The associative cells differ from conventional CAM cells, however, in that they permit data to be written to selected cells, as described hereinbelow, without necessarily changing the values in neighboring cells.) These comparisons are used in the associative memory section as the basis for performing bit-wise operations on the data words.

As explained in the related U.S. patent application and in the thesis by Akerib that are cited above, these bit-wise operations serve as the building blocks for a wide range of arithmetic and logical operations, which can thus be performed in parallel over multiple words in the associative memory section. Such operations are referred to herein as associative computations. This term is defined, in the context of the present patent application and in the claims, to mean an operation that is performed in parallel over an array of bits in a memory and includes comparison of the bits to a certain comparand and can be followed by selective write of bit values to the memory based on the results of the comparison. The selective write can include selectively writing the bit values to CAM cells and just then (directly or indirectly) to the memory. A number of examples of such processing operations are described hereinbelow. Some of the operations involve data shift and/or transposition (interchanging rows and columns, which may also be referred to as rotation), which are also performed rapidly by the associative memory section.

The computational section can also include storage cells that are not capable of performing computational tasks but can store information. These storage cells are smaller than the associative memory cells and the computational section can include much more storage cells than associative memory cells. These storage cells can store intermediate results of the associative computations. These storage cells can belong to the register section or to a buffer section.

As noted earlier, RAM devices are conventionally configured to accept read and write commands from a host processor that specify addresses at which data are to be read from or written to the memory array in the device. In embodiments of the present invention, this conventional command interface is augmented by computational commands, referred to herein as "Zcommands." These Zcommands are used by the host processor to instruct the memory device to perform a specified associative operation on the data that are stored in a certain address or range of addresses in the RAM. The syntax of the Zcommands may be the same as that of conventional read and write commands, and can include, in addition, a mode or operation code indicator.

In response to a Zcommand, the memory device transfers data from the specified RAM cells into the associative memory section, and performs a sequence of associative operations on the data (referred to herein as "micro-commands") that implement the Zcommand. A sequence of associative operations can be referred to as a macro. The result is transferred back to the RAM cells, where it may be read out by the host. These internal data transfers and associative operations can be very fast, since they operate simultaneously on large vectors of data and avoid the bottleneck of the host memory interface, and they may take place in parallel with other host memory access operations.

A microcontroller or a logic circuit that is less complex than a microcontroller can convert the Zcommand to multiple micro-commands. The conversion can utilize associating information that associates between the Zcommand and one or more micro-instruction sequences that should be executed in response to the Zcommand.

This novel memory device, with an embedded computational section or sections, may be installed in place of or in addition to conventional RAM storage devices in computers of various types (including computerized equipment such as mobile communication devices, game consoles and multimedia entertainment units).

Ordinary read and write operations between a host processor and the novel memory device may take place in the conventional manner, and at the same speed as in conventional RAM devices or even with the same protocol as with standard RAM devices. The computational section may be invoked by the software running on the computer as appropriate to accelerate applications that require parallel operations on large vectors of data. Some examples of such applications include graphics processing, image and video processing, 3D graphic acceleration, data search and data mining, communication, encryption and decryption, data compression, robotics and bio-informatics.

Hardware Configuration

FIG. 1 is a block diagram that schematically illustrates a memory device 20, in accordance with an embodiment of the present invention.

Device 20 is an integrated circuit device, which comprises a semiconductor substrate 23 on which one or more banks 24 of RAM cells are formed. Typically, device 20 comprises a single chip, formed on a single die of a semiconductor wafer. In this and the other embodiments that are described herein, device 20 is assumed to comprise synchronized dynamic RAM (SDRAM), but the principles of the present invention may similarly be applied using other types of memory cells, such as other types of DRAM or SRAM.

Each bank 24 in this embodiment comprises multiple sections 26 of DRAM cells, including rows of sense amplifiers 28, as are known in the art. Each section, for example, may comprise one or more arrays of 256 or 512 rows of DRAM cells, with 16,384 cells (2K bytes), or more, in each row.

Each row is addressed by a corresponding word line, while each column of cells is addressed by a bit line, which connects to a corresponding sense amplifier for readout.

In the description that follows, the terms "horizontal" and "vertical" are used, for the sake of simplicity, to refer to the respective directions of the rows and columns of memory cells in device 20, in accordance with common usage in the art. These terms themselves, however, have no intrinsic physical meaning in the context of the present invention.

In addition to the DRAM sections 26, each bank 24 comprises a computation section (also referred to as computation engine or computational section) 30, which comprises a number of rows of associative memory cells and associated logic. The size of the memory associative cell row can equal a size of the memory row.

The structure of computation section (also referred to as computational section) 30 is described hereinbelow with reference to FIG. 5. Computation section 30 may be deployed in various ways relative to the DRAM sections, some of which are shown in FIGS. 2-4.

Although only one computation section 30 is shown in each bank 24 in FIG. 1, there may alternatively be multiple computational sections 30 in each bank 24, and possibly even one computational section 30 for each section 26 of DRAM cells. Furthermore, although all of banks 24 in memory device 20 are shown in FIG. 1 as comprising a respective computational section 30, memory device 20 may alternatively comprise one or more computational sections 30 in only one or a few of the banks 24 of memory cells, while the remaining banks are used only for data storage. One computation section can be connected to all (or multiple) memory banks.

According to an embodiment of the invention the RAM can include only a compute sections with only registers and no associative (CAM) rows. It is noted that the buffer section is optional as is the register section and the processing section.

The computation section may include only a register and a buffer section, and an internal transfer (IT) controller.

One of the banks can include a "complete" computation section and other banks have a non-processing "compute" section.

Yet for another example, a computational section can be provided without tag rows if (for example) the output of compares can be directed to the compute rows themselves.

An external component such as host processor, such as a central processing unit (CPU) 22 of a computer, interacts with device 20 via an embedded controller 32.

According to an embodiment of the invention the embedded memory controller 32 is a microcontroller. The microcontroller can be connected to a computational engine controller (not shown) that can include command sequencer 34. It is noted that device 20 can include a microcontroller without computational section controller. It is noted that the device can include multiple controllers The controllers can be arranged in a multiple level hierarchy. One example of such a hierarchy can include a microcontroller, a compute section controller and a command sequencer between the host and the actual compare-write hardware. There may be more levels in the hierarchy, there might be a plurality of controllers at any level of the hierarchy and there might be specialized tasks for the controllers such as a compare-write controller and a load-read controller. Yet for another example, the whole hierarchy can collapse to a single layer and the entire controllers can be implemented into one unit that does the whole job itself and directly.

Microcontroller Enhanced Integrated Circuit

Figure 13:
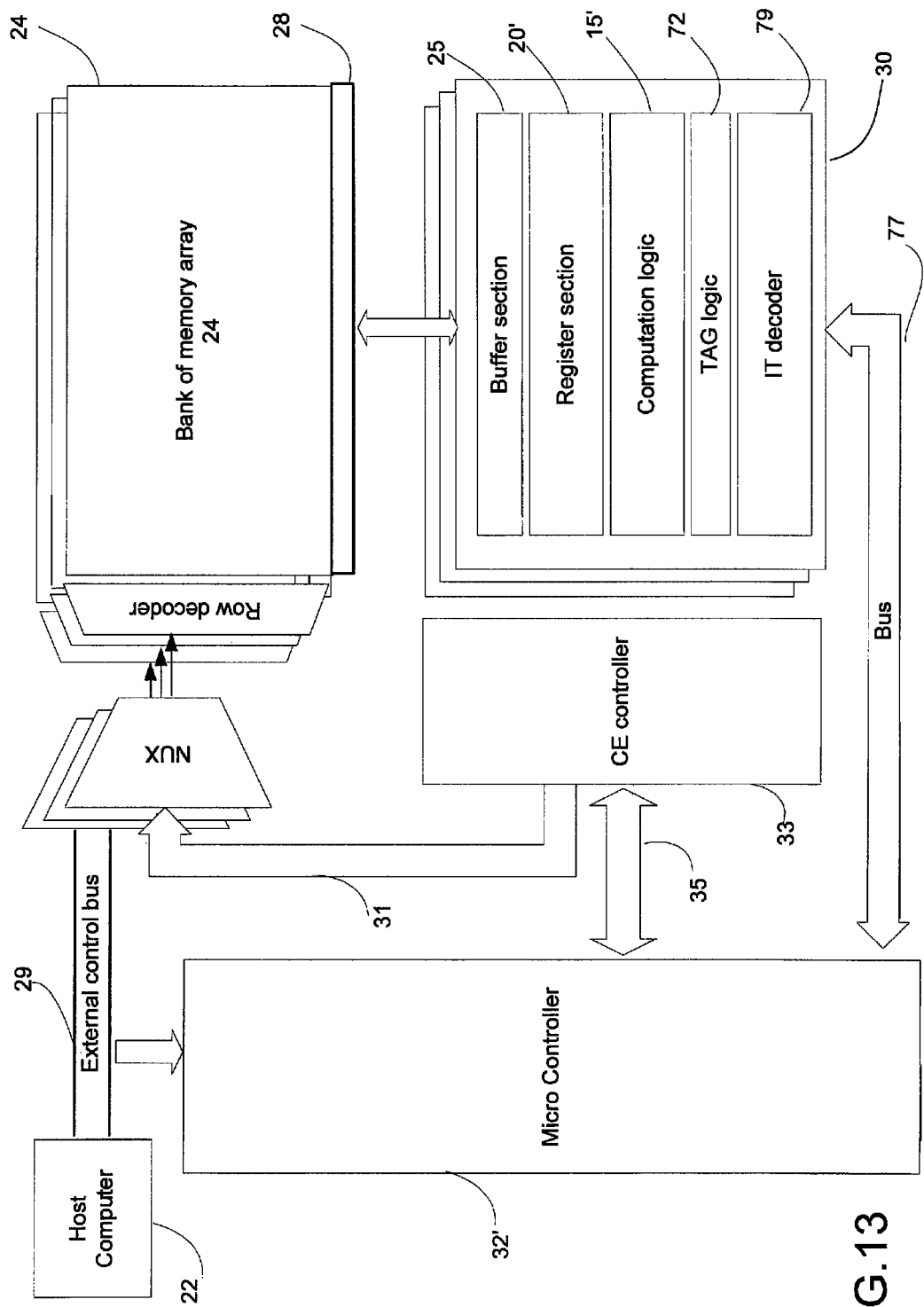
FIG. 13 illustrates a microcontroller and a computational engine controller, according to an embodiment of the invention.

FIG. 13 illustrates microcontroller 32' and Computational engine (CE) controller 33 according to an embodiment of the invention. Host computer 22 is connected to RAM array and to microcontroller 32' via external control bus 29. Microcontroller 32' is connected to Computational engine controller (CEC) 33 via bus 35 and to computational section 30 via bus 77. Computational engine controller 33 is connected to computational section 30 via one or more busses that are not shown for simplicity of explanation.

In some embodiments multiple CEC may exist, one for each CE. In these cases each CEC can execute a different string of micro instructions in parallel to the rest. If only one CEC exists then only one string of micro instruction is executed at a time at it may be executed on one or more CE at once.

It is noted that external control bus 29 can be the same bus that is used to interface the RAM array even if the microcontroller 32' does not exist—the "original" control bus can be used.

Microcontroller 32' can receive a Zcommand from host computer 22 and in response start executing a program. During execution the microcontroller 32' can instruct Computational engine controller 33 to execute one or more sequences of micro-instructions. Computational engine controller 33 sends to computational section 30 one micro-instruction after the other.

Bus 77 is connected between microcontroller 32' and banks of the memory array (such as bank 24) operates concurrently with the external controller bus 29. Thus, instruction fetching does not block data transfers between memory array 24 and external devices. In order to enable fast data access by the computational section 30, and in order that this data transfer won't block data transfers between memory array 24 and external devices, computational section 30 can include a register section 20'. Data can be transferred between computation logic 15' and register section 20' very quickly and this data transfer does not interfere with memory array 24 operations.

Computational section 30 includes a buffer section 25, register section 20', computational logic 15', TAG logic 72 and internal transfer controller 79. Computation logic 15' includes associative memory cells (denoted 70 in FIG. 5), compared register (78 of FIG. 5) and mask register (80 of FIG. 5). Internal transfer controller 79 can be a multiplexer that is used to choose a portion of a column of data to be transferred from one CE 30 to microcontroller 32' or to another CE.

According to another embodiment of the invention the controller is less complex than a microcontroller. While microcontroller 32' can perform flow control (for example—manage loops, conditional branches, subroutine and function calls etc) such an embedded memory controller can execute macro-instruction but is not capable of flow control. Macro-instructions are illustrated in further details in the sub-section titled "MACROS".

Device with Multiple Isolating Circuits

Figure 14:
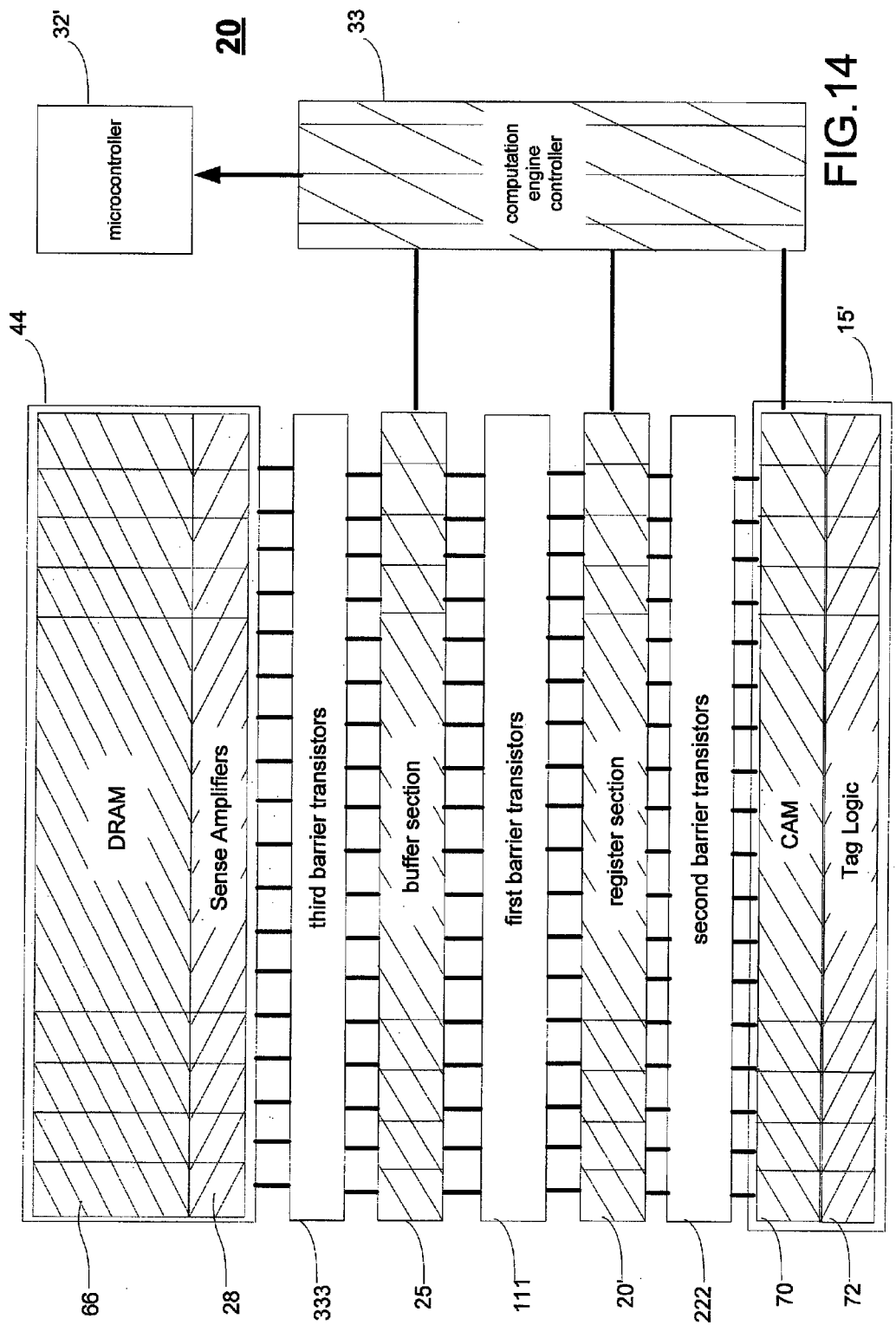
FIG. 14 illustrates a device according to an embodiment of the invention.

FIG. 14 illustrates device 20 according to an embodiment of the invention.

Device 20 includes computational engine controller 33, microcontroller 32', array of DRAM cells 44, sense amplifiers 28, three isolating circuits—(i) first barrier transistors 111 that are connected between buffer section 25 and register section 20'; (ii) second barrier transistors 222 that are connected between register section 20' and computational logic 15', and (iii) third barrier transistors 333 that are connected between RAM cells 44 and buffer section 25.

Each out of these isolating circuits can be controlled individually so as to isolate various circuits of device 20 from other circuits.

For example, information can be processed by computation logic 15', and moved between computation logic 15' and register section 20'. Accordingly, during this phase the second barrier transistors 222 are transparent—they provide connectivity between computation logic 15' and register section 20'.

During the mentioned above processing information can be moved between DRAM cells 44 and buffer section 25. Accordingly, third barrier transistors 333 can be transparent.

In order that these two sets of operations can run concurrently and not interfere with one another, the first barrier transistors 111 is activated—they isolate register section 20' from buffer region 25.

During another point in time information can moved between buffer section 25 and register section 20'. Accordingly, the first barrier transistors 111 are transparent.

Third barrier transistors 333 can be deactivated when DRAM cells 44 exchange information with an external components—but this is not necessarily so.

Multiple Access RAM

According to various embodiments of the invention both the computational section as well as external components should be allowed to access the DRAM cells. The RAM cells can be arranged in multiple arrays Concurrent access can require access control in order to prevent access errors.

The RAM cells can be arranged in multiple sections—for example they can be arranged in multiple banks. According to an embodiment of the invention different banks can be accesses simultaneously.

The access (by an external component and, additionally or alternatively, by the computational section) can be subject to an access control mechanism. The access control mechanism can be implemented by interfacing circuitry. Various access control mechanisms can be provided. For example, various banks can be (at least temporarily) allocated for external component accesses while other banks can be (at least temporarily) allocated for computational section accesses.

Yet for another example, device 20 can provide a hardware indication that indicates the accessibility of one of its banks. The hardware indication can be provided by one or more dedicates pins or busses. The number of a busy bank can be provided over such pins. Alternatively only a busy/accessible pin is provided. It is noted that various accessibility indications can be provided using time division multiplex techniques—thus utilizing existing pins to convey various types of information. If, for example, the RAM has a JEDEC compliant interface then an additional pin (or multiple pins) can be allocated for providing accessibility indication.

Yet for another example an acknowledge (ACK) or not—acknowledge (NACK) pin can be added to indicate to an external memory controller that its last command succeeded or not, on a fail the memory controller can retry. In a DRAM this could indicate if the last "row activation" succeeded. A failure could be caused when the internal controller has activated a different row in the same bank. In a similar way the internal controller will receive a success indicator when it attempts to activate a row.

Yet for a further example—the accessibility of RAM cells can be indicated by a semaphore. The semaphore can be stored in a certain RAM bank and indicate an accessibility of another RAM bank.

Yet for a further example—the accessibility of RAM cells can be indicated by a semaphore. The semaphore can be stored in a dedicated address in the RAM device. Before accessing the section of shared RAM a process must first Test & Set the semaphore and access only if the semaphore indicates that access is allowed. After access is complete the semaphore must be released. Such a semaphore can be updated by using an atomic read modify write operation.

In order to allow multiple accesses to different RAM cells various resources can be duplicated. For example, device 20 can include at least one (row and/or line) decoder that is utilized for accesses from external components and at least one other (row and/or line) decoder that is utilized for accesses from the computational section. RAM cells can be connected in parallel to multiple decoders to enable multiple accesses.

The ability of the computational section to access RAM cells can cause timing ambiguities—as an external component—when accessing RAM cell does not know whether the computational circuit currently accesses these cells, whether the computational circuit currently accesses cells that belong to the same page or bank, whether it attempts to access a RAM row that has just been accessed, whether a cleanup process has ended and the like. In order to solve this timing problem it is suggested to determine predetermined periods between access attempts of external components to RAM cells. Thus—such an external component waits for a predetermined period after an occurrence of a failed access attempt. After this predetermined period ends the external component can continue to access the RAM cells.

When a semaphore is used the external component can attempt to read the semaphore a predetermined period after a previous semaphore reading attempt resulted in reading a semaphore that indicates that the external component is temporarily prevented from accessing the at least portion of the array of RAM cells.

For example—it is assumed that the RAM cells are arranged in eight banks. Only six out of the eight banks can be visible to external components. The host computer can be configured to access these six banks as well as a seventh bank. The seventh bank can store a semaphore. The host computer may not access any data in the seventh bank before reading this special semaphore address. A certain value of the semaphore facilitates further access to the seventh bank by the host computer. If the semaphore indicates that the host computer can not access the seventh bank then the host computer should wait (for a predefined period) before trying to access this bank again. During the host computer access the computational section can not access the seventh bank. The value of the semaphore can be changed by writing a value to the address or merely by performing an access to this address.

According to an embodiment of the invention access errors are solved by preventing (at least temporarily) the computational section from directly accessing the array of RAM cells. In this case the computational section is configured to receive a read command from RAM cells of the host computer and to copy a content of the RAM cells to the computational section.

The computational section includes (as illustrated in FIG. 13) storage cells and a computational section controller. The Computational engine controller can be configured to receive a "read from RAM cells command" from the host computer and to copy a content of the RAM cells to the storage cells.

Accordingly, multiple accesses to the RAM can be facilitated by performing at least one of the following or a combination thereof: (i) Time division: each section of DRAM is allocated for either internal use (computational operations) or external use. The allocation is controlled by the external system such as a host processor. When the section is allocated for external use RAM rows can be copied into the CE by sending explicit commands of the interface bus; (ii) hardware semaphore: In which each time a memory section is accessed an internal semaphore mechanism checks to see if the section is not being accessed by another process and returns a failure (NACK) if it is; (iii) Software semaphore: similar to hardware semaphore but the acquiring of the software by the external process is done by reading a predetermined address thus no NACK pin is needed.

Macros

As indicated above, the standard memory interface of device 20, however, is augmented with a set of "Zcommands," as noted above. These commands may be invoked by the host processor by writing specified command words to a memory-mapped command register (not shown) in device 20, A Zcommand can trigger an execution of an entire program, or a macro—a single sequence of micro-instructions. The commands themselves are typically memory-mapped to addresses in the DRAM sections, thus enabling the host processor to specify a certain computational operation to be performed on the data wherein the commands are stored at a specified address and.

Referring back to FIG. 1, controller 32 refers the Zcommands for execution to a command sequencer 34, which then generates strings of micro-commands to computation sections 30 that cause the Zcommands to be carried out. The strings of commands are either hardcoded into the sequencer or they can reside in RAM memory as macros. Details of the command sequencer 34 are described hereinbelow with reference to FIG. 6. It is noted that command sequencer 34 and controller 32 (of FIG. 1) be integrated.

Although controller 32 and sequencer 34 are shown in the FIG. 6, for the sake of conceptual clarity, as separate functional blocks, the functions of the controller and sequencer may be implemented together in a single control logic unit on chip 23. It is noted that both controller 32 and sequencer 34 can be implemented by a such as microcontroller 32'.

Ram & Compute Section

FIG. 2 is a block diagram that schematically shows one possible implementation of memory bank 24, in accordance with an embodiment of the present invention. In this implementation, the memory bank includes a storage region 40 and a computation region 42. The storage region comprises multiple sections 26 (sixty-four sections in this example) of DRAM cells, which may be used for data storage in the conventional manner. In addition, a dedicated section 44 of DRAM cells can be used to store data on which computations are to be performed by computation section 30. This data can also be stored in non-dedicated sections or only partly in a dedicated circuit. Typically, host processor writes data on which section 30 is to operate to section 44, while storing other data in region 40. Computational section 30 can include buffer section 25, register section 20', computational logic 15', TAG logic 72 and internal transfer controller ("IT decoder") 79. Computational logic 15' includes associative memory cells (denoted 70 in FIG. 5), compared register (denoted 78 in FIG. 5) and mask register (denoted 80 in FIG. 5).

Dedicated DRAM section 44 is coupled so as to enable rapid data transfer to and from computation section 30. Typically, an entire row of bits can be transferred at once between sections 44 and 30, in an operation requiring only one or two clock cycles.

FIG. 3 is a block diagram that schematically shows another possible implementation of a memory bank 50, in accordance with an embodiment of the present invention. Memory bank 50 may be used in place of bank 24 in device 20. In bank 50, each section 26 comprises a top array 54 and a bottom array 56 of DRAM cells, separated by an array of sense amplifiers 28. The top and bottom array may each include 256 rows of cells, for example. This sort of arrangement is common in DRAM devices that are known in the art.

Bank 50, however, includes at least one computation region 58, comprising a central slice 60 in which a computation section 64 is sandwiched between the rows of sense amplifiers 62 of the top and bottom arrays.

The computation section 64 includes buffer section 25, register section 20', computational logic 15', TAG logic 72 and internal transfer controller ("IT controller") 79. Computational logic 15' includes associative memory cells (denoted 70 in FIG. 5); compared register (78 of FIG. 5) and mask register (80 of FIG. 5).

Data bits stored in the cells of arrays 54 and 56 in region 58 are transferred to the computation section, when required, via the sense amplifiers. This arrangement permits rapid, efficient data transfer between the storage and computation sections of region 58 in the memory device. Although FIG. 3 shows only a single computation region of this sort, two or more of storage sections 26, or even all of the storage sections, may be configured as computation regions, with a central computation section as in region 58.

FIG. 4 is a block diagram that shows details of the organization of sections 44 and 30 in computation region 42, in accordance with an embodiment of the present invention. Section 44 comprises an array 66 of DRAM cells, which are arranged in a matrix of rows (not shown) and columns 68. Each column is served by one of sense amplifiers 28.

Computational section 30 includes buffer section 25, register section 20', computational logic 15', TAG logic 72 and instruction transfer controller ("IT controller") 79. Computational logic 15' includes associative memory cells (denoted 70 in FIG. 5); compared register (78 of FIG. 5) and mask register (80 of FIG. 5).

Associative memory cells 70, storage cells of register section 20' and cells of buffer section 25 are likewise arranged in multiple rows and columns 68. In other words, the horizontal pitch of the associative cells (i.e., the distance by which adjacent columns are mutually spaced) in section 30 matches the pitch of the DRAM cells in section 44, and the bit lines (not shown in this fig.) of columns 68 in array 66 continue through to array 70.

This sort of arrangement is not mandatory, but it enhances the speed of data transfer and ease of implementation of the computation section. Section 30 also comprises a row 72 of tag logic cells, which serve as flag bits for the computations performed in section 30, as described hereinbelow.

Because the associative cells of section 30 are column-aligned with the DRAM cells in section 44, a full row of data can be loaded at once from array 66 into a row of buffer section 25, from buffer section 66 to register section 20' and from register section 20' to a row of array 70. Alternatively, the row can be loaded in multiple cycles if the interface between array 66 and the CE engine is narrower than an entire row.

In addition, a fall row of data can be loaded at once from a row of array 70 to register section 20' from register section 20' to buffer section 66 and from buffer section 66 into a row of array 66. Conveniently, register row 20' is used for storing intermediate results of the computational section 30.

To perform the data transfer (from DRAM 66 or to DRAM 66), the word line (not shown) of the source row in question is asserted, and sense amplifiers 28 latch the data in the source row. The word line of the destination row is then asserted, thus causing the data to be transferred from the sense amplifiers via the bit lines to the destination row. The same operation is performed in reverse in order to transfer data from the associative cells in array 70 back to the DRAM. Thus, the associative cells in array 70 are directly attached to the DRAM cells in array 66, and are thus embedded in the DRAM readout circuitry without any intervening input/output (I/O) buffer.

Some operations performed by computation section 30 involve shifting the contents of a row right or left. Such shift operations may be accomplished within section 30 in operations that require only a few clock cycles. Alternatively, sense amplifiers 28 may be configured to carry out a switching function (in addition to their normal sensing function), so that upon receiving a shift command, the sense amplifiers transfer the data on their respective bit lines over to the next column. As a result, the shift is accomplished simultaneously with the data transfer operation.

FIG. 5 is a block diagram that schematically shows further details of computation section 30, in accordance with an embodiment of the present invention. Array 70 comprises multiple rows of associative memory cells 74 and an additional row 72 of tag cells 76. Alternatively, array 70 may comprise a smaller or larger number of rows, although typically a number of rows between three and eight give an optimal balance between computational efficiency and consumption of chip "real estate" in device 20.

Like CAM cells, associative memory cells 74 contain compare logic, which compares the bit held in the cell to a corresponding bit value of a comparand held in a comparand register 78. When all of the bits in a column of array 70 match the values of the corresponding bits of the comparand, the compare logic sets the tag bit held in tag cell 76 for that row. Thus, row 72 indicates which columns of array 70 match the comparand. A mask held in a mask register 80 may be used to limit the comparison to certain rows: The comparison is performed only in those rows for which the mask bit is set, and the remaining rows are ignored.

Section 30 may be used to perform a wide range of data manipulations and computations, including vector addition and vector multiplication, inter alia, using a very simple and limited set of micro-commands, such as read, write, compare and shift. A number of examples of these sorts of operations are described in the next section. Other associative operations of these sorts are described in the above-mentioned related application, "Memory Device with Integrated Parallel Processing." Although the design of the memory device that is used to implement the associative operations in that application differs from the devices that are described in the present patent application, the principles of the computations that are described in that application may also be applied, mutatis mutandis, in devices based on the principles of the present invention.

FIG. 6 is a block diagram that schematically shows details of command sequencer 34, in accordance with an embodiment of the present invention. As noted earlier, controller 32 passes Zcommands from host processor 22 to sequencer 34, which queues the commands in a first-in-first-out (FIFO) buffer 82 prior to execution. It is noted that sequencer 34 can store the commands in a memory unit that differs from a FIFO buffer 82 and that commands can be executed out of order. Control logic 84 interprets each command to generate a corresponding sequence of micro-commands to computation section 30. The control logic may be implemented, for example, as a finite state machine, which steps through the sequence of micro-commands corresponding to each Zcommand. The state machine and the resultant execution of the micro-commands may be driven at the normal clock rate of memory device 20, or alternatively at a faster clock rate (such as a multiple of the normal clock rate).

The micro-commands comprise command primitives (referred to as "Zprimitives") and command parameters. The command primitives 88, which are held in a code memory, may include the following:

Read (load data) from a specified source row in array 66 into a specified target row in array 70. The read operation can involve loading data to buffer section 25, register set 20' and only then to the specified target row in array 70.

Write (store data) from a specified source row in array 70 into a specified target row in array 66. The write operation can involve loading data from the row in array 70 to a row of register set 20', to buffer section 25 and only then to the specified target row in array 66.

The read and write operations may actuate the corresponding word lines of the source and target rows, as follows: compare the bit vectors in the columns of array 70 to a comparand in comparand register 78 (possibly subject to a mask in mask register 80); and shift the contents of the tag register left or right.

Registers 86 contain and output the parameters required for execution of the Zprimitives, such as row numbers and comparand and mask values.

Command sequencer 34 can operate separately from controller 32. Additionally or alternatively, host processor 22 may continue to access memory device 20 while the command sequencer and computational section 30 carry out the required computations. In this sort of parallel operation, for example, while the computational section operates on data in one of banks 24, the host processor may write and/or read data to the other banks. When the computation has been completed, controller 32 may signal the host processor, which then reads out the result from the appropriate target location in the memory bank.

It is noted that the mentioned above device utilizes multiple parallel processes. Host processor 22 can access memory 24 while other internal accesses/computation is proceeding. Internal logic can move data from data banks 24 to buffer section 25 at the same time that computations are proceeding between register section 20' and computation logic 15'.

Performing Associative Computations in the Memory Device

As a very simple sort of parallel computation, consider a command to shift all the data in a given memory row one bit to the left. This sort of operation can be carried out by computational section 30 in one to three clock cycles. Assuming the second row is to be shifted, the following command sequence may be used:

TABLE I

COMMAND SEQUENCE FOR SHIFT
SET MASK (0100).

COMPARE (x1xx) - Compares each bit in the second row to the value
"1" and sets the corresponding bit in tag row 72 if there is a
match. No comparison is made in the other rows since the
corresponding mask bit is not set.
WRITE (x0xx) - For all columns in which the tag bit is set, writes the
value "0" to the second row.
SHIFT (-1) - Shifts the bits in the tag row one column to the left.
WRITE (x1xx) - for all columns in which the tag bit is set, writes the
value "1" to the second row.

The write commands in Table I are examples of "selective write" operations, i.e., specified bit values are written selectively to a set of certain bits in the row in question, while the remaining bits are unchanged. In this case, the bits are selected on the basis of the comparison results that are held in the tag row. It is also possible to write selectively from a source row of data in the computation section to a target row in the RAM section by latching the sense amplifiers only on the bit lines of the bits that are to be written to the RAM.

Figure 8:
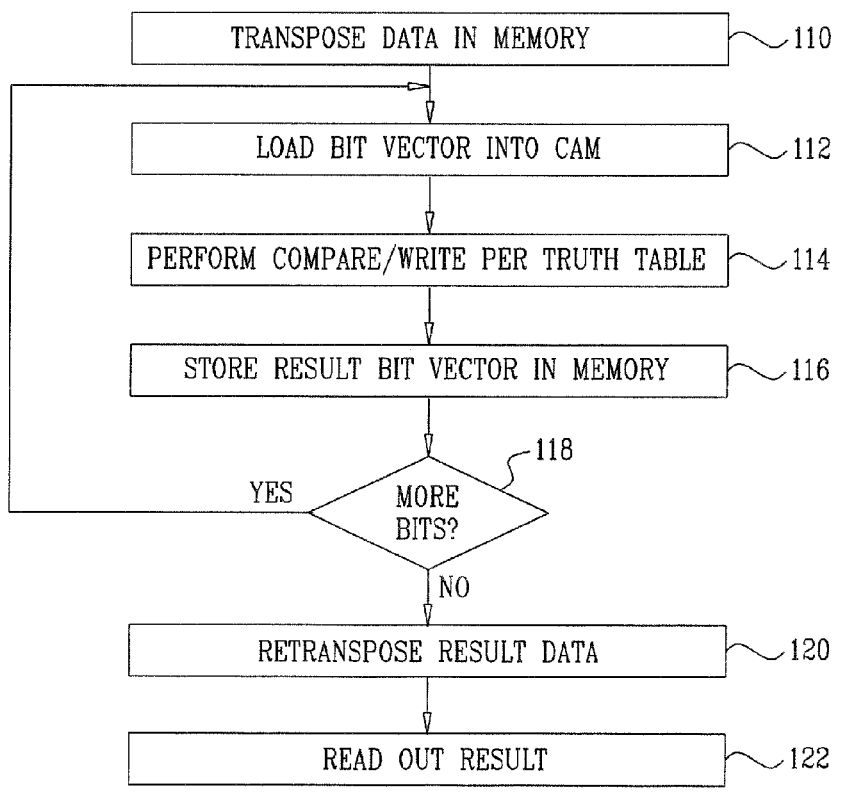
FIG. 8 is a flow chart that schematically illustrates a method for performing a computation, in accordance with an embodiment of the present invention.

Reference is now made to FIGS. 7 and 8, which schematically illustrate a method for adding together two sets of numbers that are stored in memory device 20, in accordance with an embodiment of the present invention. FIG. 7 is a block diagram showing the storage locations of the numbers in computation region 42 in the course of the computation. FIG. 8 is a flow chart that presents key steps in the method. The method is shown and described here just as one illustrative example of parallel arithmetic operations that may be carried out using a memory device with a computational section. Other sorts of computations that may be carried out using associative operations in the sorts of device architectures that are described above are also considered to be within the scope of the present invention.

In the example shown in FIGS. 7 and 8, device 20 receives a command from host 22 to sum a first array of data words (marked "A"), stored in a region 90 of section 44, with a second array of data words (marked "B") stored in a region 92, and to write the result ("A+B") to a region 94. The data words are assumed to be eight-bit numbers, with the least significant bit (LSB) referred to as "BIT 0", and the most significant bit (MSB) referred to as "BIT 7," and it is accordingly convenient (for reasons that will become clear below) that sections 90, 92 and 94 each contain eight rows of memory cells. The principles of the method described here, however, may equally be applied to numbers of any length and regions of any size. The numbers in regions 90 and 92 are summed in computational section 30 bit by bit, from LSB to MSB, using a row 96 in section 30 to hold the appropriate bits from A; a row 98 to hold the appropriate bits from B, which are then replaced by the bitwise sum A+B; and a row 100 to hold an interim carry bit (CY), which is carried forward from each bit to the next more significant bit.

Initially, host processor 22 writes the arrays of data words to regions 90 and 92 in the conventional row-wise manner, with each word occupying one byte (eight consecutive cells), arranged sequentially in the rows of the appropriate region.

In order to perform the summation efficiently in section 30, the words in regions 90 and 92 are first transposed, in a transposition step 110. Following this step, the bits of each word are ordered sequentially in a single column, from LSB to MSB, as indicated by the vertical arrows in FIG. 7. The effect of the transposition is shown below in Tables II and III, wherein Table II shows the positions of the bits of each data word (<a0, . . . , a7>, <b0, . . . , b7>, <x0, . . . , x7>, <y0, . . . , y7>, . . . ) before transposition, and Table III shows the positions after transposition:

TABLE III

| OPERANDS AFTER TRANSPOSITION | | | | | | |
|---|---|---|---|---|---|---|
| a0 | x0 | b0 | y0 | | c0 | z0 |

TABLE II

| OPERANDS BEFORE TRANSPOSITION | | | | | | | | | | | | | | | | | |
|---|---|---|---|---|---|---|---|---|---|---|---|---|---|---|---|---|---|
| a0 | a1 | a2 | a3 | a4 | a5 | a6 | a7 | b0 | b1 | b2 | b3 | b4 | b5 | b6 | b7 | c0 | c1 |
| x0 | x1 | x2 | x3 | x4 | x5 | x6 | x7 | y0 | y1 | y2 | y3 | y4 | y5 | y6 | y7 | z0 | z1 |
| a1 | x1 | | | | | | | b1 | y1 | | | | | | | c1 | z1 |
| a2 | x2 | | | | | | | b2 | y2 | | | | | | | c2 | z2 |

The transposition may be accomplished efficiently by loading the rows of the data words in regions 90 and 92 into computational section 30 one by one, and performing the following compare-write-shift routine, under the control of command sequencer 34 and using tag logic 72 in the manner described above:

TABLE IV

TRANSPOSITION PSEUDO-CODE

```
Load L1 with "1" in each bit location j, "0" elsewhere;
For (j = 0; j < 8,
{
Load row j from memory into L0 with offset j;
For (i=0; i < 8, i++)
{
Compare (L0,L1); Write to L(i + 3);
Shift Left L0;
}
Shift Right L1;
}
```

In the code above, the successive rows in section 30 are labeled L0, L1, L2, the bit locations along each row are labeled (0, 1, 2, 3, 4, 5, 6, 7, 0, 1, 2, 3, 4, 5, 6, 7, 0, . . . ).

Line 1 of the code thus loads L1 with the vector (1, 0, 0, 0, 0, 0, 0, 0, 1, 0, 0, 0, 0, 0, 0, 0, 0, 1, . . . ), and line 10 shifts this vector one column to the right in each iteration. The "Compare" operation in line 7 is a bitwise comparison, which causes a "1" to be written to the corresponding bit position in L(i+3) when the bits of L0 and L1 match, and "0" otherwise. After the transposition is complete, the transposed operands are copied back to region 90 or 92 as appropriate.

The code above assumes, for the sake of simplicity, that section 30 has a sufficient number of rows to contain all eight bits of all the transposed data words. Alternatively, if section 30 does not have a sufficient number of rows, the transposition may be carried out four bits at a time, for example, or even in smaller segments. Further alternatively, the transposition may be carried out in software or using techniques described in the above-mentioned patent application entitled "Memory Device with integrated Parallel Processing."

After the data in regions 90 and 92 have been transposed, command sequencer 34 instructs computational section 30 to load the first row from each of the regions into rows 96 and 98 of the computational section, respectively, at a vector loading step 112. As a result, the LSBs of all of the data words in A are loaded into row 96, and the LSBs of all the data words in B are loaded into row 98. The computational section then performs a bitwise addition on each pair of bits in rows 96 and 98 and overwrites the data in row 98 with the result, at an addition step 114. The addition step is carried out by a combination of compare and write operations, using a truth table that implements bitwise addition, as described below.

When appropriate, a carry bit (CY) is written to row 100, and this carry bit is then used in the next iteration through step 114. The computation section then writes the result in row 98 back to the corresponding row in region 94, at a vector storing step 116, and goes on to process the remaining rows of regions 90 and 92 in order until all bits have been summed, at a new iteration step 118.

It can be shown that the bitwise addition performed at step 114 can be

TABLE V

| TRUTH TABLE FOR ADDITION | | | | |
|---|---|---|---|---|
| INPUT | | | OUTPUT | |
| A | B | CY | A + B | CY |
| 0 | 0 | 1 | 1 | 0 |
| 0 | 1 | 1 | 0 | 1 |
| 1 | 1 | 0 | 0 | 1 |
| 1 | 0 | 0 | 1 | 0 | expressed by the following truth table:

In other words, if the bits in (A,B,CY) in a given column of computational section 30 match the input pattern in one of the rows of Table V, then the resulting values (A+B,CY) in that row of the table are written to the corresponding bit positions in rows 98 and 100 of computational section 30. The order of the comparisons is important, i.e., to give the correct result, the comparands should be loaded into register 78 and the corresponding results written to rows 98 and 100 in the order of the rows in Table V. Mask register 80 is not needed explicitly in this computation, i.e., the mask value is (1,1,1). Although there are four other possible combinations of input bit values (A,B,CY) that are not listed in Table V, these other combinations are omitted from the table and need not be tested, because they leave the corresponding bit values in rows 98 and 100 unchanged.

The sequence of operations performed by computation section 30 may be expressed in pseudo code as follows:

TABLE VI

PSEUDOCODE FOR BITWISE ADDITION

Compare(0,0,1); Write(0,1,0)
Compare(0,1,1); Write(0,0,1)
Compare(1,1,0); Write(1,0,1)
Compare(1,0,0); Write(1,1,0)

In each line of the code, the write operation is executed if the result of the comparison is TRUE. Executing each line of the code requires one clock cycle, meaning that if there are 16,000 cells in each row of section 30, the addition itself is performed at a rate of 4K bits per cycle. The other operations involved in the method of FIG. 8 are similarly rapid, typically taking no more than one or two clock cycles each.

Other sorts of arithmetic and logical operations may similarly be carried out in computational section 30 using sequences of compare and write operations given by appropriate truth tables. The theory of these truth tables and practicalities of their use are described further in the above-mentioned related patent application and thesis by Akerib.

After the results of the bitwise addition for all of the rows in regions 90 and 92 have been written back to region 94, the data in this region are retransposed back to the conventional row-wise representation, at a retransposition step 120. The retransposition is carried out in essentially the same manner as were the transpositions at step 110. Controller 32 then reads out the result to host processor 22, at a data readout step 122.

FIG. 9 is a block diagram that schematically illustrates a method for performing a neighborhood computation in computational section 30, in accordance with an embodiment of the present invention. Neighborhood operations, typically involving sequences of additions and multiplications of neighboring bit values, are common in image and signal processing, for example. To facilitate such operations, computational section 30 creates two replicas of an input bit vector that is held in a row 130 of the computational section: one replica in which the bits are shifted one position to the right, in a row 132; and another in which the bits are shifted one position to the left, in a row 134. The shifts may each be accomplished, in one to three clock cycles, in the manner shown above in Table 1. Larger shifts may be produced simply by repeating the shift procedure.

After the shifted replicas have been created, the computational section can perform a neighborhood operation on each bit in row 130 by applying an appropriate truth table to the column containing the bit. Other, more complex neighborhood operations may be performed using combinations of the techniques described above.

Neighborhood operations typically are computationally complex, but the ability of computational section 30 to process many (for example, 16K) bits in parallel reduces drastically the number of computational clock cycles needed to perform such operations on large arrays of data values.

Internal Transfer Controller

According to an embodiment of the invention only portions of a content of row can be transferred between various components such as buffer section 25', register section 20', computational logic 15'. Internal Transfer controller 79 can assist in sending only a portion of a row between these various components.

These partial transfers can be used in various situations. For example—when data has been copied into register section 25' in order that external processes can proceed in parallel with internal computation (performed by computational logic 15') without mutual interference and when there is a need to copy data from one section of a register row to another section in the same register row or in a different register row. The data to me copied is much less than the size of a row. This data transfer can be controlled by IT controller 79.

IT controller 79 can receive as input the source and destination rows that participate in the data transfer (row addresses) as well as offsets into the source and destination rows (row positions). It can always move a fixed amount of memory (fixed portion of a column) or it can take a third set of arguments specifying the quantity of data to copy.

The IT controller 79 shall have its own column decoders. If registers are used, the column and (register) row decoders should be built for and attached to these registers. The IT controller 79 can use dedicated (internal) buses for transferring the data and not use external buses that can be required for other (external) processes.

IT controller 79 can include multiplexing components, buffers, an interconnect and the like. It can apply well known data transfer techniques.

Cell-Level Architecture

The functions of computational section 30 may be realized using CAM designs that are known in the art. CAM cells, however, are typically larger than DRAM cells, since they contain compare logic in addition to a data storage cell. For rapid data transfer to and from the computational section and efficient use of chip real estate, it is desirable that the columns of section 30 be aligned with the columns of the RAM storage section (such as section 44 in FIG. 4) that holds the data on which the computational section is to operate. The same bit lines may then run through each column the RAM section and a corresponding column of the associative cells in the computational section.

Therefore, in some embodiments of the present invention, the shape of the associative cells and their logic is designed to match the horizontal pitch of the RAM columns, so that the columns of associative cells are aligned with the RAM columns. The alignment may be one-to-one, i.e., with a column of associative cells for each RAM column, so that the columns of the associative cells have the same pitch as the RAM columns. Alternatively, the alignment may be n-to-one, with a column of associative cells serving n (two or more) columns of RAM by means of suitable selection logic connected to the RAM bit lines, so that the pitch of the columns of the associative cells is an integer (n) multiple of the pitch of the RAM columns. One such design, in which each column of associative cells serves two adjacent RAM columns, is shown by way of example in the fig. s that follow, but alternative designs that achieve the same end are also considered to be within the scope of the present invention.

FIG. 10 is a schematic circuit diagram illustrating a column of associative cells 74 in computational section 30, in accordance with an embodiment of the present invention.

This fig. assumes, by way of illustration, that section 30 contains four rows of associative cells 74 and a row of tag logic cells 76. Only one of the associative cells is shown in detail (and the other cells are assumed to be substantially identical). The tag logic cell is shown in detail in FIG. 12.

Figure 11:
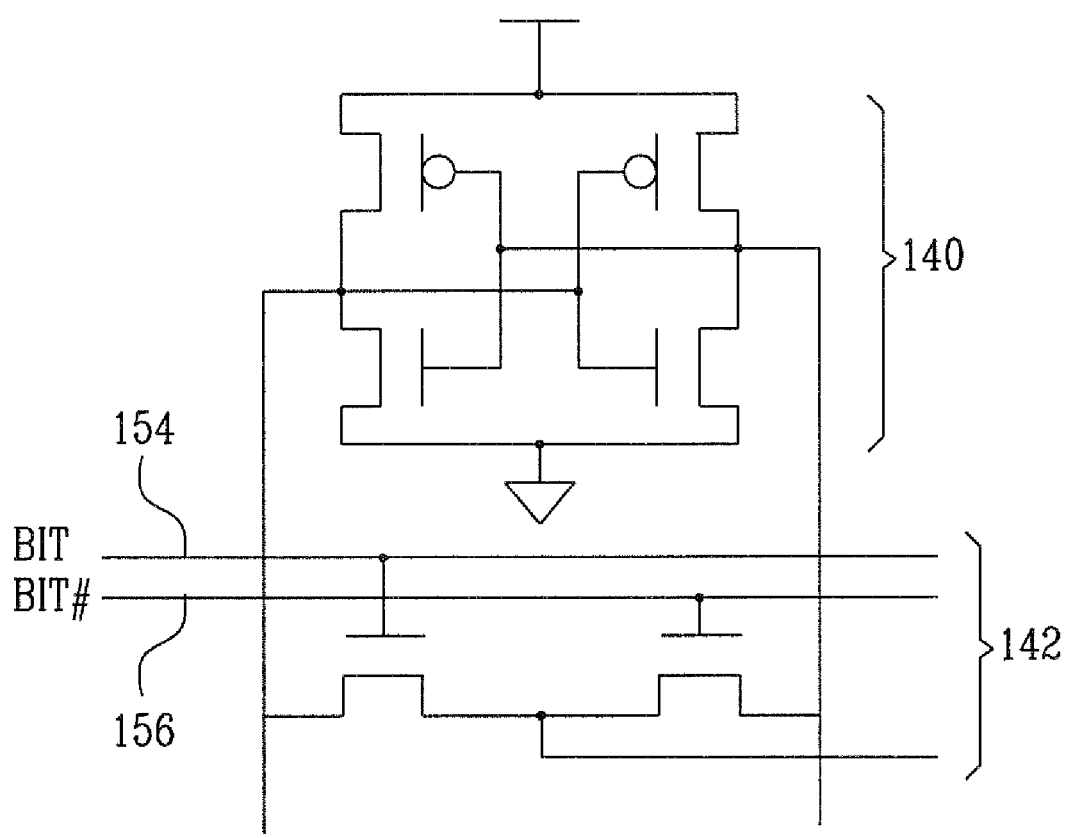
FIG. 11 is a schematic circuit diagram that shows details of storage cell and a compare logic, in accordance with an embodiment of the present invention.

Bit lines 144 and 146 (corresponding to BL# and BL) of cell 74 are connected by selection logic 148 to primary sense amplifiers 28 in two corresponding columns of RAM section 44. Cell 74 comprises a storage cell 140 and compare logic 142. (Details of these components are shown in FIG. 11.) Switching logic 152 couples the compare logic selectively to bit lines 144 and 146 and to a diffusion line 150, which is connected to tag logic 76.

FIG. 11 is a schematic circuit diagram that shows details of storage cell 140 and compare logic 142, in accordance with an embodiment of the present invention. The storage cell is similar in structure to a conventional DRAM sense amplifiers. The compare logic compares the contents of the storage cell to the bit value (BIT) in the corresponding cell of comparand register 78, which is asserted on lines 154 and 156. When a given bit is masked (by entering a zero value in the corresponding bit of mask register 80), both of lines 154 and 156 are held at the value zero.

Figure 12:
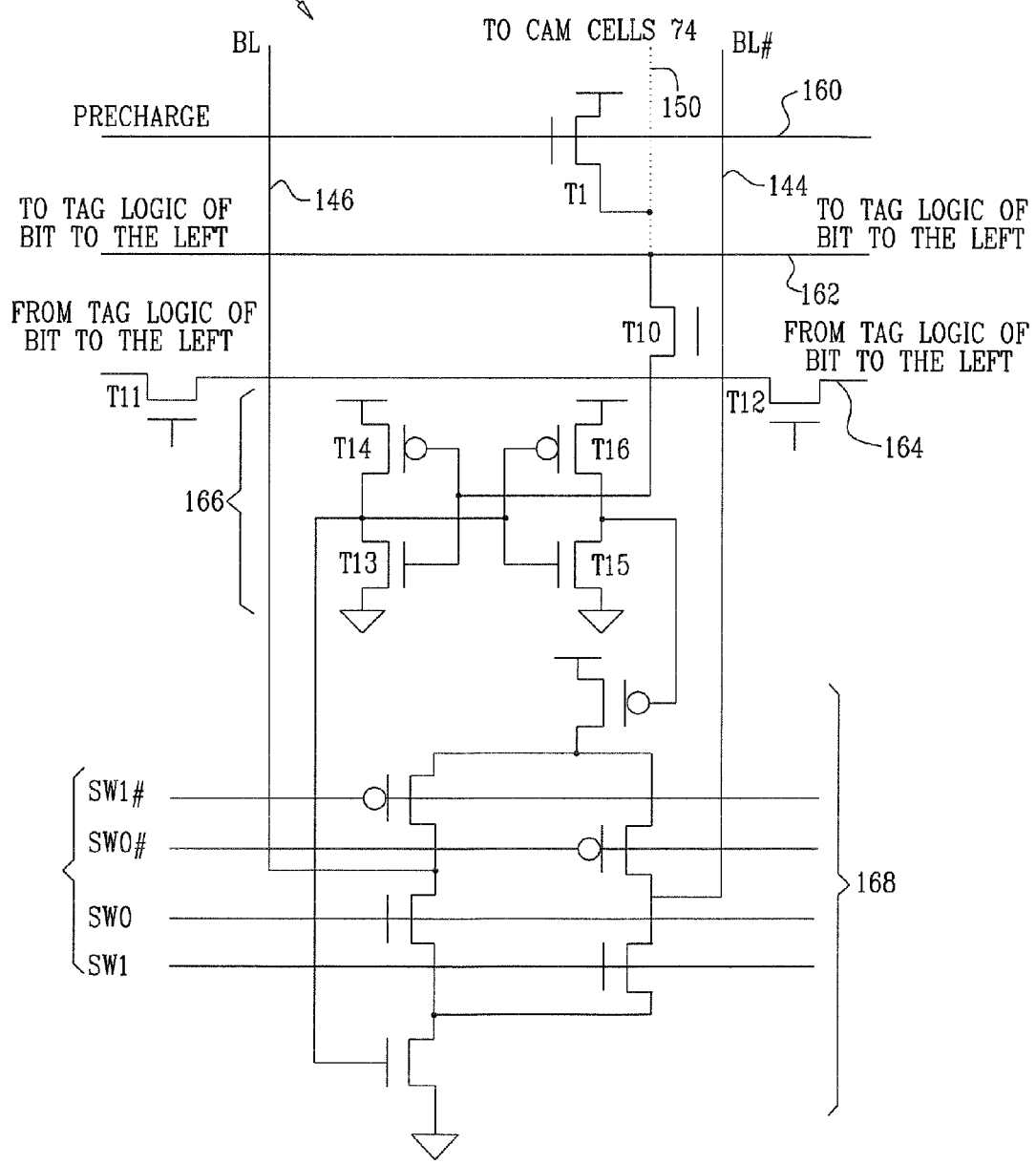
FIG. 12 is a schematic circuit diagram that shows details of a tag cell, in accordance with an embodiment of the present invention.

FIG. 12 is a schematic circuit diagram that shows details of tag cell 76, in accordance with an embodiment of the present invention.

Compare logic 142 in associative cells 74 is precharged from a precharge line 160 via a transistor T1 and diffusion line 150. In the next clock phase, the diffusion line will be discharged if the stored values in cells 74 do not match the comparand. A storage cell 166 in tag cell 76 receives and holds the result of the comparison that appears on the diffusion line. The comparison value, or its complement, can be written back to one or more of the associative cells via switching logic 168 and bit lines 144 and 146, in accordance with the write commands provided by command sequencer 34.

Row lines 162 and 164 connect tag cell 76 to its right and left neighbors. The contents of the tag cells can then be shifted left or right by appropriately switching transistors T10, T11 and T12.

Flow Chart

FIG. 15A illustrates method 300 for computing, according to an embodiment of the invention.

Method 300 starts by stage 310 of providing a memory device comprising an array of random access memory (RAM) cells, which are disposed on a semiconductor substrate and are configured to store data, and comprising a computational section, which comprises associative memory cells, which are disposed on the substrate in communication with the array of the RAM cells.

Stage 310 is followed by stage 320 of receiving a command.

Stage 320 is followed by stage 330 of determining if the command is a first command (if so—stage 330 is followed by stage 340) or a second command (if so—stage 330 is followed by stage 350).

Stage 340 includes performing read and write operations on the data in the RAM cells in response to first commands from a host processor to the memory device.

Stage 350 includes performing associative computations on the data in the computational section in response to a second commands from a host processor to the memory device.

Stage 350 can include at least one of the following stages or a combination thereof, illustrated in FIG. 15B:

Stage 351 of controlling the associative computation by a microcontroller.

Stage 352 of receiving, by the microcontroller, a command from a host processor invoking the associative computation, and issuing, responsively to the command, at least one sequence of micro-commands that cause the computational section to perform the associative computation, and to return a result to the array of the RAM cells.

Stage 353 of receiving, by the microcontroller, a command from a host processor invoking the associative computation, and to issuing, responsively to the command, multiple micro-commands that cause the computational section to perform the associative computation, and returning at least one result to the array of the RAM cells; wherein the issuing of the multiple micro-commands comprises applying a flow control scheme.

Stage 354 of implementing, by the microcontroller, a finite state machine.

Stage 355 of storing stage information in few state registers of the microcontroller.

Stage 356 of receiving, by a control logic that is less complex than a microcontroller, a command from a host processor invoking the associative computation; issuing, responsively to the command, a sequence of micro-commands that cause the computational section to perform the associative computation, and returning a result to the array of the RAM cells.

Stage 357 of controlling the flow of micro-commands by the microcontroller.

It is noted that either one of stages 340 and 350 require access to RAM cells. This access can be selectively granted to external devices and the computational section. The access control is illustrated by stage 360 of performing access control.

Stage 360 can include at least one of the following stages or a combination thereof, illustrated in FIG. 15C:

Stage 361 of facilitating an access to RAM cells from an external component by utilizing at least one decoder and facilitating an access to RAM cells from the computational section by utilizing at least one other decoder.

Stage 362 of allowing simultaneous accesses to different RAM cells.

Stage 363 of allowing an access by the computational section and allowing another simultaneous access by an external component.

Stage 364 of blocking at least one portion of the array of RAM cells from access of external components and allowing the computational section to access the at least one portion.

Stage 365 of blocking at least one bank from access of external components and allowing the computational section to access the at least one bank.

Stage 366 of controlling an access of an external component to at least a portion of the array of RAM cells by a semaphore.

Stage 367 of attempting to read the semaphore, by an external component, a predetermined period after a reading a semaphore indicative that the external component is temporarily prevented from accessing the at least portion of the array of RAM cells.

Stage 368 of preventing the computational section from directly accessing the array of RAM cells. In this case either one of stages 369 and 370 can be executed.

Stage 369 of receiving, by the computational section a read command from RAM cells of the host computer and copying a content of the RAM cells to the computational section.

Stage 370 of receiving, by a computational section controller, a read from RAM cells command of the host computer and copying a content of the RAM cells to the storage cells.

Stage 371 of outputting, by at least one hardware port, information indicative of accessibility of at least one portion of an array of RAM cells.

FIG. 16 illustrates method 400 for computing, according to an embodiment of the invention.

Method 400 starts by stage 410 of providing a memory device comprising an array of random access memory (RAM) cells, which are disposed on a semiconductor substrate and are configured to store data, and comprising a computational section, which comprises associative memory cells, and storage cells; wherein the associative memory cells are disposed on the substrate in communication with the array of the RAM cells; wherein the storage cells are smaller than associative memory cells and do not have computational capabilities.

Stage 410 is followed by stages 420 and 430.

Stage 420 includes storing at a buffer section of the computational section information from RAM cells of the array of RAM cells. The information can be provided from one row of RAM cells to one row of the buffer section.

Stage 420 is followed by stage 422 of storing at multiple storage cells information from the buffer section of the computational section. The information can be provided from one row of the buffer section to one row of storage cells. The storage cells can be arranged in rows that are also referred to as register rows. The information transfer can includes transferring a portion of a row.

Stage 422 is followed by stage 424 of providing the information to associative memory cells of the computational section. An entire row or a portion thereof can be transferred and stored.

Stage 430 includes storing at multiple storage cells information from the memory associative cells. An entire row or a portion thereof can be transferred and stored.

Stage 430 is followed by stage 432 of storing at a buffer section of the computational section information from the multiple storage cells. The information can be provided to one row of RAM cells from one row of the buffer section.

Stage 432 is followed by stage 334 sending to of RAM cells the information from the buffer section. The information can be provided to one row of RAM cells from one row of the buffer section.

It is noted that the information from the associative memory cells can include intermediate results that are returned to the associative memory cells but not set to the array of RAM cells and that the information can include a final result that should be sent to the RAM cells.

Stages 420 and 434 can involve utilizing sense amplifiers that are coupled between the buffer section and the array of RAM cells.

It is noted that method 400 can include isolating between various sections during the exchange of information. This is illustrated by stage 450 of selectively isolating cells.

Stage 450 can include at least one of the following stages or a combination thereof:

Stage 451 of selectively isolating the buffer section from the storage cells by first barrier transistors.

Stage 452 of selectively isolating the associative memory cells from the storage cells by second barrier transistors.

Stage 453 of isolating, during a first operational mode, the associative memory cells from the storage cells while providing connectivity between the buffer section and the storage cells; and isolating, during a second operational mode, between the buffer section and the storage cells while providing connectivity between the associative memory cells and the storage cells.

Stage 454 of selectively isolating the associative memory cells from the register cells by second barrier transistors.

It will be appreciated that the embodiments described above are cited by way of example, and that the present invention is not limited to what has been particularly shown and described hereinabove. Rather, the scope of the present invention includes both combinations and subcombinations of the various features described hereinabove as well as variations and modifications thereof which would occur to persons skilled in the art upon reading the foregoing description and which are not disclosed in the prior art.

The invention claimed is:

1. An integrated circuit device comprising:
    a semiconductor substrate;
    sense amplifiers;
    an array of random access memory (RAM) cells, which are arranged on the substrate in first columns and are configured to store data; and
    a computational section comprising associative memory cells, which are arranged on the substrate in second columns, which are aligned with respective first columns of the RAM cells and are in communication with the respective first columns so as to receive the data from the array of the RAM cells via the sense amplifiers, to perform an associative computation on the data, the associative computation comprising an operation that is performed in parallel over the data and comprising comparison of the data to a comparand, and performing a selective write of bit values to the array of RAM cells based on the results of the comparison, by latching the sense amplifiers only on bit lines of bits that are to be written to the array of RAM cells.

2. The device according to claim 1 further comprising a microcontroller.

3. The device according to claim 2 wherein the microcontroller is configured to receive a command from a host processor invoking the associative computation, and to issue, responsively to the command, at least one sequence of micro-commands that cause the computational section to perform the associative computation, and to return a result to the array of the RAM cells.

4. The device according to claim 3, wherein the at least one sequence of micro-commands are memory-mapped to the addresses in the array of the RAM cells.

5. The device according to claim 2 wherein the microcontroller is configured to receive a command from a host processor invoking the associative computation, and to issue, responsively to the command, multiple micro-commands that cause the computational section to perform the associative computation, and to return at least one result to the array of the RAM cells; wherein the issuing of the multiple micro-commands comprises applying a flow control scheme.

6. The device according to claim 5, wherein the multiple sequences of micro-commands are memory-mapped to the addresses in the array of the RAM cells.

7. The device according to claim 2 wherein the microcontroller is configured to implement a finite state machine.

8. The device according to claim 3 wherein the microcontroller comprises few state registers that arc configured to store state information.

9. The device according to claim 2 wherein the microcontroller is coupled to the computational section via a dedicated bus.

10. The device according to claim 1 comprising at least one decoder that is utilized for accesses from external components and at least one other decoder that is utilized for accesses from the computational section.

11. The device according to claim 1 comprising control logic that is less complex than a microcontroller; wherein the control logic is configured to receive a command from a host processor invoking the associative computation, and to issue, responsively to the command, a sequence of micro-commands that cause the computational section to perform the associative computation, and to return a result to the array of the RAM cells.

12. The device according to claim 1 comprising interfacing circuitry that enables simultaneous accesses to the array of RAM cells.

13. The device according to claim 12 wherein one access of the multiple accesses is made by the computational section and another access of the multiple accesses is made by an external component.

14. The device according to claim 1 wherein at least one portion of the array of RAM cells is blocked from access of external components wherein the computational section is configured to access the at least one portion.

15. The device according to claim 1 wherein the device comprises multiple RAM cell banks and wherein at least one RAM cell bank is blocked from access of external components wherein the computational section is configured to access the at least one RAM cell bank.

16. The device according to claim 1 wherein an access of an external component to at least a portion of the array of RAM cells is controlled by a semaphore.

17. The device according to claim 16 wherein the semaphore is stored in another portion of the array of RAM cells.

18. The device according to claim 16 further comprising an external component that is configured to attempt to read the semaphore a predetermined period after a reading a semaphore indicative that the external component is temporarily prevented from accessing the at least portion of the array of RAM cells.

19. The device according to claim 1 wherein the computational section is at least temporarily prevented from directly accessing the array of RAM cells.

20. The device according to claim 19 wherein the computational section is configured to receive a read command from RAM cells of the host computer and to copy a content of the RAM cells to the computational section.

21. The device according to claim 19 wherein the computational section comprises storage cells and a computational section controller; wherein the Computational engine controller is configured to receive a read from RAM cells command of the host computer and to copy a content of the RAM cells to the storage cells.

22. The device according to claim 1 comprising a JIEDEC compliant interface.

23. The device according to claim 1 comprising at least one hardware port that outputs information indicative of an accessibility of at least one portion of an array of RAM cells.

24. The device according to claim 1 wherein the computational section comprises multiple storage cells configured to store information; wherein storage cells are smaller, faster or less complex than associative memory cells.

25. The device according to claim 24 wherein the computational section comprises more storage cells than associative memory cells.

26. The device according to claim 24 wherein a number of storage cells exceeds at least twice a number of the associative memory cells.

27. The device according to claim 24 wherein the storage cells are configured to store intermediate results of the associative computation.

28. The device according to claim 24 wherein the storage cells are configured to exchange information with RAM cells of the array of RAM cells and to exchange information associative memory cells.

29. The device according to claim 24 comprising a buffer section that is coupled to sense amplifiers; wherein the sense amplifiers are also coupled to the array of RAM cells.

30. The device according to claim 24 wherein the buffer section is coupled to the storage cells via first barrier transistors that are configured to selectively isolate the buffer section from the storage cells.

31. The device according to claim 24 wherein the associative memory cells are coupled to the storage cells via second barrier transistors that are configured to selectively isolate the associative memory cells from the storage cells.

32. The device according to claim 24 wherein during a first operational mode the second barrier transistors isolate the associative memory cells from the storage cells and the first barrier transistor are transparent and wherein during a second operational mode the first barrier transistors isolate a buffer section from the storage cells and the second barrier transistors are transparent.

33. The device according to claim 24 wherein the associative memory cells are coupled to the storage cells via second barrier transistors that are configured to selectively isolate the associative memory cells from the storage cells.

34. The device according to any claim of claims 2, 12, 16 and 24 wherein the RAM cells comprise dynamic RAM (DRAM) cells.

35. The device according to any claim of claims 2, 12, 16 and 24 wherein the associative memory cells are arranged in multiple rows and columns, and wherein the computational section comprises a comparand register, for holding a comparand, and is configured to make a comparison between the data held in each of the columns and the comparand, and to write data bits to one or more of the associative memory cells responsively to a result of the comparison.

36. The device according to claim 35, wherein the computational section comprises a mask register, for holding a mask, and is configured to limit the comparison to the rows that are indicated by the mask.

37. A method for computing, comprising:
accepting and executing at least one command from a host processor to a memory device, the at least one command comprising a write command to store data at a specified address in an array of random access memory (RAM) cells formed on a semiconductor substrate in the memory device;
responsively to the at least one command, transferring the data into a computational section of the memory device, the computational section comprising associative memory cells, which are disposed on the semiconductor substrate in communication with the array of the RAM cells;
performing an associative computation on the data in the computational section, the associative computation comprising an operation that is performed in parallel over the data and comprising comparison of the data to a comparand; and
performing a selective write operation of bit values to the array of RAM cells based on the results of the comparison, by latching the sense amplifiers only on bit lines of bits that are to be written to the array of RAM cells.

38. The method according to claim 37 comprising controlling the associative computation by a microcontroller.

39. The method according to claim 38 comprising receiving, by the microcontroller, a command from a host processor invoking the associative computation, and issuing, responsively to the command, at least one sequence of micro-commands that cause the computational section to perform the associative computation, and to return a result to the array of the RAM cells.

40. The method according to claim 39, wherein the at least one sequence of micro-commands are memory-mapped to the addresses in the array of the RAM cells.

41. The method according to claim 38 comprising receiving, by the microcontroller, a command from a host processor invoking the associative computation, and to issuing, responsively to the command, multiple micro-commands that cause the computational section to perform the associative computation, and returning at least one result to the array of the RAM cells; wherein the issuing of the multiple micro-commands comprises applying a flow control scheme.

42. The method according to claim 41, wherein the multiple sequences of micro-commands are memory-mapped to the addresses in the array of the RAM cells.

43. The method according to claim 38 comprising implementing, by the microcontroller, a finite state machine.

44. The method according to claim 38 comprising storing stage information in few state registers of the microcontroller.

45. The method according to claim 38 wherein the microcontroller is coupled to the computational section via a dedicated bus.

46. The method according to claim 37 comprising facilitating an access to RAM cells from an external component by utilizing at least one decoder and facilitating an access to RAM cells from the computational section by utilizing at least one other decoder.

47. The method according to claim 37 comprising receiving, by a control logic that is less complex than a microcontroller, a command from a host processor invoking the associative computation; issuing, responsively to the command, a sequence of micro-commands that cause the computational section to perform the associative computation, and returning a result to the array of the RAM cells.

48. The method according to claim 37 comprising performing simultaneous accesses to different RAM cells.

49. The method according to claim 48 wherein one access of the multiple accesses is made by the computational section and another access of the multiple accesses is made by an external component.

50. The method according to claim 37 comprising blocking at least one portion of the array of RAM cells from access of external components and allowing the computational section to access the at least one portion.

51. The method according to claim 37 comprising blocking at least one bank from access of external components and allowing the computational section to access the at least one bank.

52. The method according to claim 37 comprising controlling an access of an external component to at least a portion of the array of RAM cells by a semaphore.

53. The method according to claim 52 wherein the semaphore is stored in another portion of the array of RAM cells.

54. The method according to claim 52 comprising attempting to read the semaphore, by an external component, a predetermined period after a reading a semaphore indicative that the external component is temporarily prevented from accessing the at least portion of the array of RAM cells.

55. The method according to claim 37 comprising preventing the computational section from directly accessing the array of RAM cells.

56. The method according to claim 55 comprising receiving, by the computational section a read command from RAM cells of the host computer and copying a content of the RAM cells to the computational section.

57. The method according to claim 55 comprising receiving, by a computational section controller, a read from RAM cells command of the host computer and copying a content of the RAM cells to the storage cells.

58. The method according to claim 37 comprising receiving commands from external components via a JEDEC compliant interface.

59. The method according to claim 37 comprising outputting, by at least one hardware port, information indicative of an accessibility of at least one portion of an array of RAM cells.

60. The method according to claim 37 comprising storing information in multiple storage cells of the computational section; wherein storage cells are smaller than associative memory cells.

61. The method according to claim 60 wherein the computational section comprises more storage cells than associative memory cells.

62. The method according to claim 60 wherein a number of storage cells exceeds at least twice a number of the associative memory cells.

63. The method according to claim 60 comprising storing intermediate results of the associative computation.

64. The method according to claim 60 comprising exchanging information between the storage cells and RAM cells of the array of RAM cells and exchanging information between the storage cells and the associative memory cells.

65. The method according to claim 60 comprising exchanging information between RAM cells and buffer section by utilizing sense amplifiers that are coupled between the buffer section and the array of RAM cells.

66. The method according to claim 65 comprising selectively isolating the buffer section from the storage cells by first barrier transistors.

67. The method according to claim 60 comprising selectively isolating the associative memory cells from the storage cells by second barrier transistors.

68. The method according to claim 60 comprising isolating, during a first operational mode, the associative memory cells from the storage cells while providing connectivity between a buffer section and the storage cells; and isolating, during a second operational mode, between the buffer section and the storage cells while providing connectivity between the associative memory cells and the storage cells.

69. The method according to claim 60 comprising selectively isolating the associative memory cells from the register cells by second barrier transistors.

70. The method according to any claim of claims 37, 48, 52, and 60 wherein the RAM cells comprise dynamic RAM (DRAM) cells.

71. The method according to any claim of claims 37, 48, 52, and 60 wherein the associative memory cells are arranged in multiple rows and columns, and wherein the computational section comprises a comparand register, for holding a comparand, and wherein performing the associative computation comprises making a comparison between the data held in each of the columns and the comparand, and writing data bits to one or more of the associative memory cells responsively to a result of the comparison.

72. The method according to claim 71, wherein the computational section comprises a mask register, for holding a mask, and wherein making the comparison comprises limiting the comparison to the rows that are indicated by the mask.

73. An integrated circuit device, comprising:
a semiconductor substrate;
an array of random access memory (RAM) cells, which are disposed on the substrate and are configured to store data;
a computational section comprising associative memory cells, which are disposed on the substrate in communication with the array of the RAM cells; and
control logic, which is configured to accept and execute first commands from a host processor specifying read and write operations to be performed on the data in the RAM cells, and to accept second commands from the host processor, which cause the computational section to perform associative computations on the data the associative computation comprising an operation that is performed in parallel over the data and comprising comparison of the data to a comparand and performing a selective write of bit values to the array of RAM cells based on the results of the comparison.

74. The device according to claim 73 wherein the control logic is a microcontroller.

75. The device according to claim 73 wherein the control logic is less complex than a microcontroller; wherein the control logic is configured to receive a command from a host processor invoking the associative computation, and to issue, responsively to the command, a sequence of micro-commands that cause the computational section to perform the associative computation, and to return a result to the array of the RAM cells.

76. The device according to claim 73 comprising interfacing circuitry that enables simultaneous accesses to the array of RAM cells.

77. The device according to claim 73 wherein an access of an external component to at least a portion of the array of RAM cells is controlled by a semaphore.

78. The device according to claim 73 wherein the computational section comprises multiple storage cells configured to store information; wherein storage cells are smaller than associative memory cells.

79. The device according to any claim of claims 73-77, wherein the control logic is configured to cause the computational section to selectively write data bits to a set of the memory cells in a row of the device while leaving the data held in the remaining memory cells in the row unchanged.

80. A method for computing, comprising:
providing a memory device comprising an array of random access memory (RAM) cells, which are disposed on a semiconductor substrate and are configured to store data, and comprising a computational section, which comprises associative memory cells, which are disposed on the substrate in communication with the array of the RAM cells;
in response to first commands from a host processor to the memory device, performing read and write operations on the data in the RAM cells; and
in response to second commands from the host processor to the memory device, performing associative computations on the data in the computational section, the associative computation comprising an operation that is performed in parallel over the data and comprising comparison of the data to a comparand, and performing a selective write operation of bit values to the array of RAM cells based on the results of the comparison.

81. The method according to claim 80 comprising controlling the associative computation by a microcontroller.

82. The method according to claim 80 comprising receiving, by a control logic that is less complex than a microcontroller, a command from a host processor invoking the associative computation; issuing, responsively to the command, a sequence of micro-commands that cause the computational section to perform the associative computation, and returning a result to the array of the RAM cells.

83. The method according to claim 80 comprising performing simultaneous accesses to the array of RAM cells.

84. The method according to claim 80 comprising controlling an access of an external component to at least a portion of the array of RAM cells by a semaphore.

85. The method according to claim 80 comprising storing information in multiple storage cells of the computational section; wherein storage cells are smaller than associative memory cells.

86. The method according to any claim of claims 80-85, wherein performing the associative computations comprises selectively writing data bits to a set of the memory cells in a row of the device while leaving the data held in the remaining memory cells in the row unchanged.

87. The device according to claim 1 comprising an internal transfer controller that controls a transfer of a portion of a column.

88. The method according to claim 37 comprising performing transfers of a portion of a column by an internal transfer controller.

* * * * *